United States Patent
Onouchi et al.

(10) Patent No.: US 11,169,284 B2
(45) Date of Patent: Nov. 9, 2021

(54) RADIATION IMAGING APPARATUS

(71) Applicant: Hitachi, Ltd., Tokyo (JP)

(72) Inventors: Masafumi Onouchi, Tokyo (JP); Takafumi Ishitsu, Tokyo (JP); Fumito Watanabe, Tokyo (JP)

(73) Assignee: HITACHI, LTD., Tokyo (JP)

( * ) Notice: Subject to any disclaimer, the term of this patent is extended or adjusted under 35 U.S.C. 154(b) by 20 days.

(21) Appl. No.: 16/719,528

(22) Filed: Dec. 18, 2019

(65) Prior Publication Data

US 2020/0225368 A1 Jul. 16, 2020

(30) Foreign Application Priority Data

Jan. 10, 2019 (JP) .............................. JP2019-002517

(51) Int. Cl.
*H01J 37/244* (2006.01)
*G01T 1/24* (2006.01)
*G01T 1/29* (2006.01)
*G01T 1/17* (2006.01)

(52) U.S. Cl.
CPC ................ *G01T 1/244* (2013.01); *G01T 1/17* (2013.01); *G01T 1/2907* (2013.01); *H01J 37/244* (2013.01)

(58) Field of Classification Search
CPC .. G01T 1/17; G01T 1/244; G01T 1/24; G01T 1/2907; H01J 37/244
See application file for complete search history.

(56) References Cited

U.S. PATENT DOCUMENTS

2019/0021687 A1* 1/2019 Kato .................... A61B 6/4241

FOREIGN PATENT DOCUMENTS

JP           2002-341044 A       11/2002

* cited by examiner

*Primary Examiner* — David P Porta
*Assistant Examiner* — Fani Boosalis
(74) *Attorney, Agent, or Firm* — Foley & Lardner LLP

(57) ABSTRACT

The present invention provides a radiation imaging apparatus capable of maintaining the quality of an image obtained even when a dose incident on a radiation detector changes suddenly. The present invention is a radiation imaging apparatus including a radiation source, a radiation detector to detect radiation emitted from the radiation source, and a cooling unit to cool the radiation detector; and is characterized in that the radiation detector has a counting circuit to output a number of photons in radiation counted per unit time as a photon counting rate, and the cooling unit controls a coolability of the radiation detector in response to the photon counting rate.

17 Claims, 18 Drawing Sheets

FIG. 10A

IMAGING OBJECT DOES NOT EXIST

| PHOTON COUNTING RATE | CALORIFIC VALUE | COOLING FAN ROTATION SPEED |
|---|---|---|
| $R_{1001}$ | $P_{1001}$ | $Q_{1001}$ |
| $R_{1002}$ | $P_{1002}$ | $Q_{1002}$ |
| ... | ... | ... |
| $R_{10N}$ | $P_{100N}$ | $Q_{100N}$ |

FIG. 10B

IMAGING OBJECT EXISTS

| PHOTON COUNTING RATE | CALORIFIC VALUE | COOLING FAN ROTATION SPEED |
|---|---|---|
| $R_{1001}$ | $P_{1011}$ | $Q_{1011}$ |
| $R_{1002}$ | $P_{1012}$ | $Q_{1012}$ |
| ... | ... | ... |
| $R_{10N}$ | $P_{101N}$ | $Q_{101N}$ |

FIG. 16A
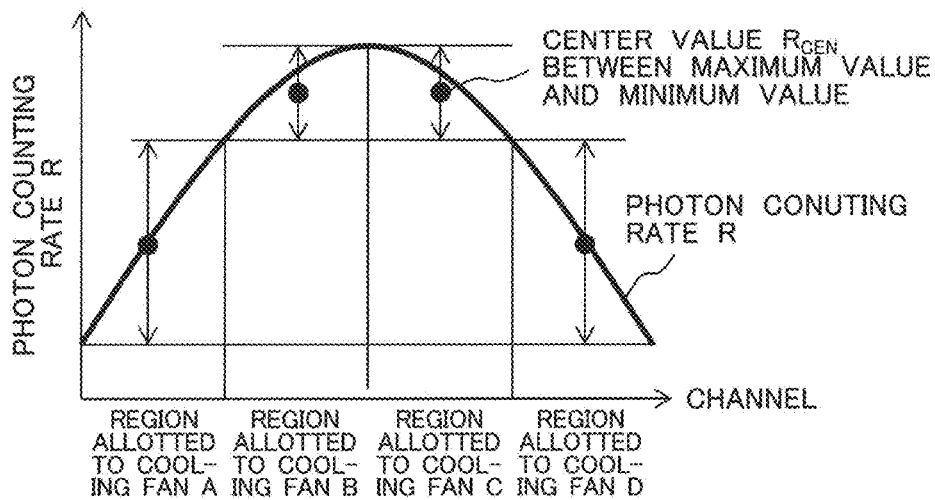
FIG. 16B
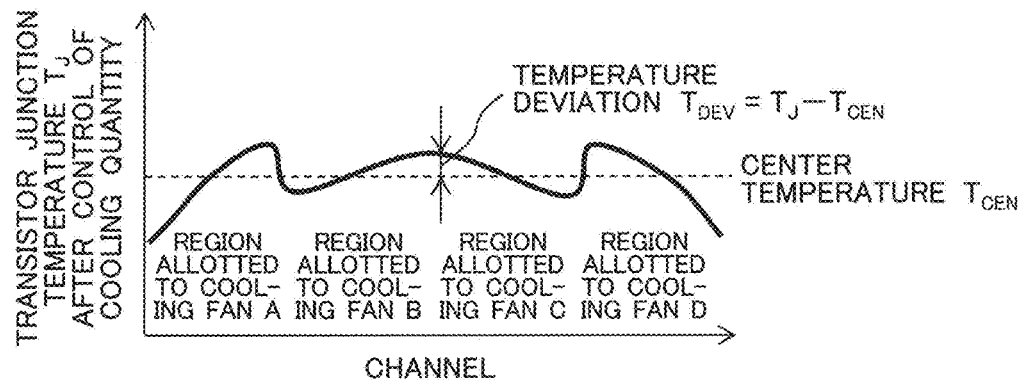
FIG. 16C
| DEVIATION BETWEEN PHOTON COUNTING RATE R AND $R_{CEN}$ | TEMPERATURE DEVIATION $T_{DEV}$ | CORRECTION COEFFICIENT |
|---|---|---|
| $R_{1601}$ | $T_{1611}$ | $C_{1611}$ |
| $R_{1602}$ | $T_{1612}$ | $C_{1612}$ |
| ... | ... | ... |
| $R_{16N}$ | $T_{161N}$ | $C_{161N}$ |

RADIATION IMAGING APPARATUS

CLAIM OF PRIORITY

The present application claims priority from Japanese Patent Application JP 2019-002517 filed on Jan. 10, 2019, the content of which are hereby incorporated by references into this application.

TECHNOLOGICAL FIELD

The present invention relates to a radiation imaging apparatus equipped with a radiation detector which increases a calorific value in response to an incident dose and a technology of inhibiting performance change of a radiation detector.

BACKGROUND

In a radiation imaging apparatus represented by a CT (Computed Tomography) apparatus, radiation penetrating an imaging object is measured by a radiation detector. Radiation detectors include a photon counting type and a charge integration type and any of the radiation detectors has a detection element to convert radiation into an electrical signal and an electronic circuit connected to the detection element. The electronic circuit is operated by radiation entering the detection element and generates heat. For example, in a photon counting unit and a detection element installed in a radiation detector of a photon counting type, a calorific value increases in response to a dose incident on the detection element. In the calorific value, a calorific value of an electronic circuit in the photon counting unit is particularly large. Heat generation in an electronic circuit causes the temperature fluctuation of a radiation detector and the temperature fluctuation affects detection accuracy and deteriorates the quality of an image obtained by a radiation imaging apparatus.

A method of controlling an endothermic/exothermic element arranged discretely on the back on the basis of a result of temperature measurement of a radiation detector in order to equalize a temperature distribution of the radiation detector is disclosed in Japanese Unexamined Patent Application Publication No. 2002-341044.

In Japanese Unexamined Patent Application Publication No. 2002-341044, however, since an endothermic/exothermic element is controlled on the basis of a result of temperature measurement of a radiation detector, the radiation detector may have been affected by heat generation already when temperature fluctuation is detected. That is, because of feedback control based on a result of heat transfer from an electronic circuit that is a heat source to a temperature measurement point, when a dose incident on a radiation detector changes suddenly, it sometimes happens that time delay is caused in the control of an endothermic/exothermic element and the quality of an obtained image deteriorates.

SUMMARY OF THE INVENTION

To cope with this, an object of the present invention is to provide a radiation imaging apparatus capable of maintaining the quality of an image obtained even when a dose incident on a radiation detector changes suddenly.

In order to attain the above object, the present invention is a radiation imaging apparatus including a radiation source, a radiation detector to detect radiation emitted from the radiation source, and a cooling unit to cool the radiation detector; and is characterized in that the radiation detector has a counting circuit to output a number of photons in radiation counted per unit time as a photon counting rate, and the cooling unit controls a coolability of the radiation detector in response to the photon counting rate.

The present invention makes it possible to provide a radiation imaging apparatus capable of maintaining the quality of an image obtained even when a dose incident on a radiation detector changes suddenly.

BRIEF DESCRIPTION OF THE DRAWINGS

FIGS. 10A and 10B are views showing an example of a table used for coolability control according to the first embodiment;

FIGS. 16A to 16C are views explaining correction processing to mitigate influence of variation of circuit characteristics caused by a temperature difference between detection elements;

DETAILED DESCRIPTION OF EMBODIMENTS

Embodiments according to the present invention are explained hereunder in reference to the drawings. Here, a radiation imaging apparatus according to the present invention is applied to an apparatus having a radiation source and a radiation detector in which a calorific value increases in response to an incident dose. The following explanations are based on a case where radiation is an X-ray, a radiation detector is a photon counting type X-ray detector, and a radiation imaging apparatus is an X-ray CT apparatus.

First Embodiment

Figure 1:
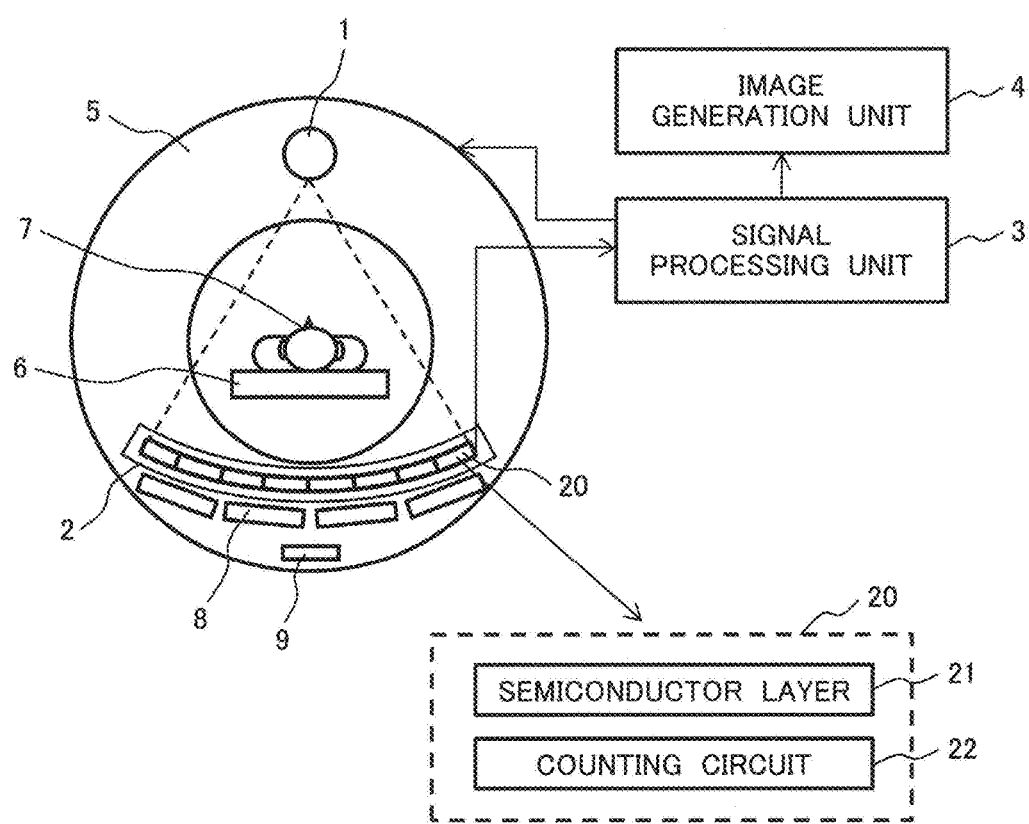
FIG. 1 is a view showing an overall configuration of an X-ray CT apparatus to which the present invention is applied.

An X-ray CT apparatus according to the present embodiment, as shown in FIG. 1, has an X-ray source 1 to emit an X-ray, an X-ray detector 2 in which a plurality of detection elements to detect X-rays are arrayed two-dimensionally, a signal processing unit 3 that applies processing of correction and the like to detection signals by the detection elements and controls the apparatus, and an image generation unit 4 to generate an image of an imaging object 7 by using corrected signals. The X-ray source 1 and the X-ray detector 2 are configured so as to be fixed to a rotation plate 5 at opposing positions and rotate relatively to the imaging object 7 around the imaging object 7 lying on a bed 6. Here, a unit including the X-ray source 1, the X-ray detector 2, and the rotation plate 5 is collectively referred to also as a scanner.

A detection element 20 constituting the X-ray detector 2 is a photon counting type detector and has a semiconductor layer 21 to output an incident X-ray as an electric charge corresponding to a photon and a counting circuit 22 to count an electric charge outputted from the semiconductor layer 21 and output a counting signal. The semiconductor layer 21 includes cadmium zinc telluride (CZT), cadmium telluride (CdTe), or the like for example.

While the X-ray source 1 and the X-ray detector 2 arranged oppositely rotate around the imaging object 7, emission of an X-ray from the X-ray source 1 and detection of an X-ray having penetrated the imaging object 7 by the X-ray detector 2 are repeated. A counting signal outputted by the counting circuit 22 in the X-ray detector 2 is subjected to the processing of correction or the like at the signal processing unit 3, then is transmitted to the image generation unit 4, and generates a tomographic image (CT image) of the imaging object 7 by the image generation unit 4.

Meanwhile, a dose of an X-ray penetrating an imaging object 7, namely a number of photons counted by the counting circuit 22, varies in response to a position of the X-ray detector 2 and a rotation angle of the rotation plate 5. The counting circuit 22 has to be cooled because the counting circuit 22 generates heat in response to the incidence of an X-ray into the semiconductor layer 21 and is influenced by temperature fluctuation caused by the heat generation. In the present embodiment therefore, a cooling fan 8 and a cooling fan controller 9 are installed as a cooling unit to cool the X-ray detector 2. A plurality of cooling fans 8 are installed and each of the cooling fans 8 generates wind for air-cooling a plurality of detection elements 20. The cooling fan controller 9 controls an air volume of each cooling fan 8. A calorific value of the counting circuit 22 increases in response to a photon counting rate that is a number of photons counted per unit time and hence the cooling fan controller 9 adjusts an air volume of each cooling fan 8 on the basis of a photon counting rate. The operation temperatures of the semiconductor layer 21 and the counting circuit 22 are kept substantially constant by controlling a coolability by air volume adjustment of each cooling fan 8.

Figure 2A:
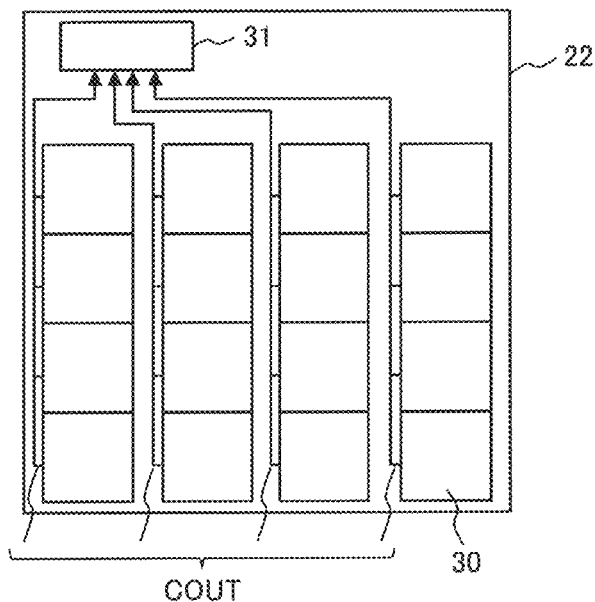
FIGS. 2A and 2B are views showing a configuration of a counting circuit and a photon counting unit.

A configuration of a counting circuit 22 is explained in reference to FIG. 2A. A counting circuit 22 is configured as an integrated circuit including many circuit elements (LSI) and, as shown in FIG. 2A, has a plurality of photon counting units 30 and an output unit 31 to aggregate and output counting results of the multiple photon counting units 30. In the example of FIG. 2A, both photon counting units 30 and pixels are arranged in a matrix of 4×4 respectively and photons incident on the semiconductor layer 21 are counted at each photon counting unit 30, in other words at each pixel. A number of counted photons is notified to the output unit 31 at every predetermined timing notified from a host device such as the signal processing unit 3. Here, a signal aggregated at each photon counting unit 30 when a counting result is outputted to the signal processing unit 3 or the like is represented by COUT in FIG. 2A.

Figure 2B:
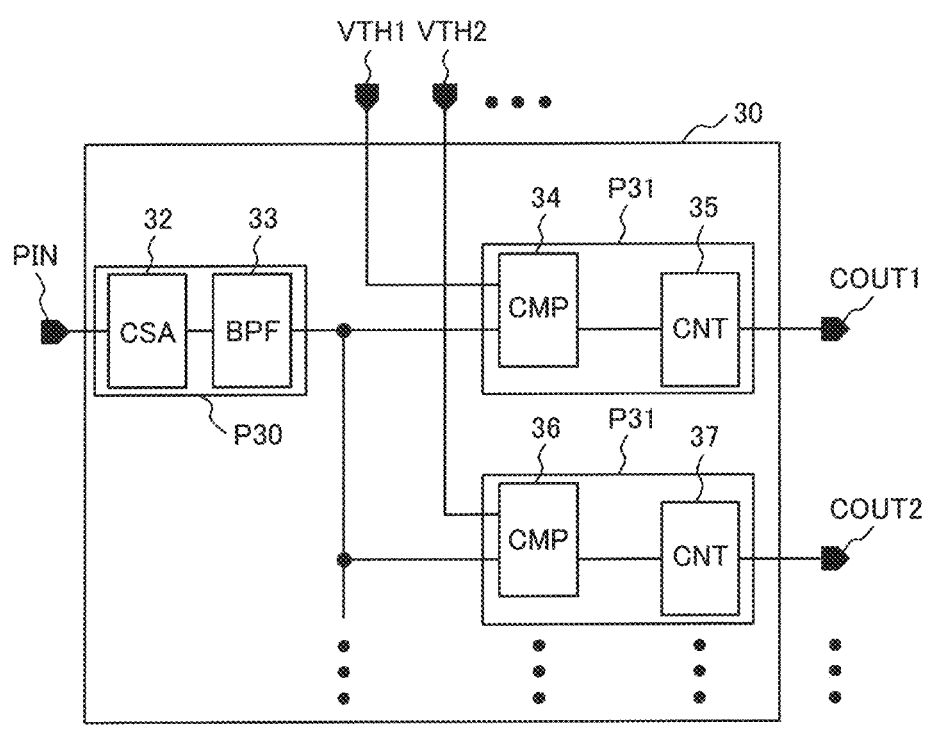

A configuration of a photon counting unit 30 is explained in reference to FIG. 2B. Input pins to a photon counting unit 30 are a current input pin PIN and threshold voltages VTH1, VTH2, etc. and output pins from the photon counting unit 30 are count value output pins COUT1, COUT2, etc. A threshold voltage means a threshold value of energy of an X-ray, is configured so as to discriminate and detect X-rays of multiple energy levels, and has a relationship of VTH1<VTH2<VTH3 . . . , for example.

A photon counting unit 30 has circuit elements, such as a charge amplifier (CSA) 32, a band pass filter (BPF) 33, voltage comparators (CMP) 34, 36, etc. and counters (CNT) 35, 37, etc. The same numbers of the voltage comparators 34, 36, etc. and counters 35, 37, etc. as the number of discriminated energy levels are installed and different threshold voltages are inputted to the voltage comparators respectively. Further, a calorific value per one pulse generated at the charge amplifier 32 and the band pass filter 33 is defined as P30, and a calorific value per one pulse generated at the voltage comparator 34 and the counter 35 is defined as P31. Here, when the circuit configurations of the voltage comparator 36 and the counter 37 are identical to the circuit configurations of the voltage comparator 34 and the counter 35, a calorific value per one pulse generated at the voltage comparator 36 and the counter 37 is also P31. The actual values of the calorific values P30 and P31 per one pulse can be obtained by circuit simulation or post-production test of the counting circuit 22.

Operations of the photon counting unit 30 are explained. A current pulse inputted from the current input pin PIN is shaped as a voltage pulse by the charge amplifier 32 and the band pass filter 33 and outputted to the voltage comparator 34, etc. At the voltage comparator 34, etc., a peak value of a shaped voltage pulse signal is compared with the threshold value VTH1, etc. and a frequency at which the peak value exceeds the threshold value VTH1, etc. is counted by the counter 35, etc. and outputted as COUT1, etc. COUT2 may be subtracted from COUT1, for example, to obtain a number of pulses at energy levels corresponding to a range between the threshold value VTH1 and the threshold value VTH2. The subtraction may be applied either at the photon counting unit 30 or at the output unit 31. COUT1, COUT2, etc. that are outputs from the counters of the photon counting unit 30 are notified to the output unit 31.

Since the photon counting unit 30 operates in this way, a frequency at which the charge amplifier 32 and the band pass filter 33 operate is equal to a number of current pulses generated during X-ray detection. Further, a frequency at which the voltage comparator 34, etc. and the counter 35, etc. operate is equal to a frequency at which peak values of voltage pulses outputted from the band pass filter 33 exceed the threshold voltage VTH1, etc. That is, a frequency at which the circuit elements in the photon counting unit 30 operate is determined by a number of current pulses inputted in the photon counting unit 30 and peak values of voltage pulses.

Figure 3A:
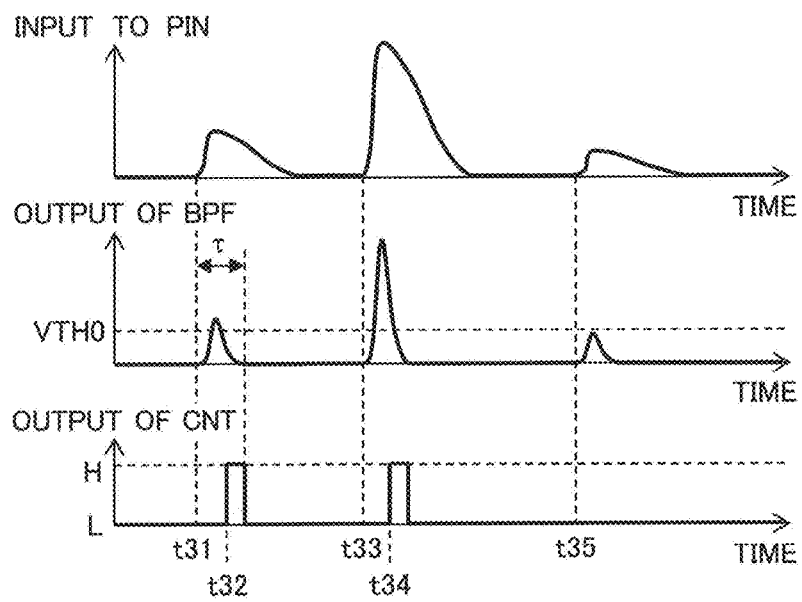
FIGS. 3A to 3C are views explaining a relationship between operation and temperature of a photon counting unit.
Figure 3B:
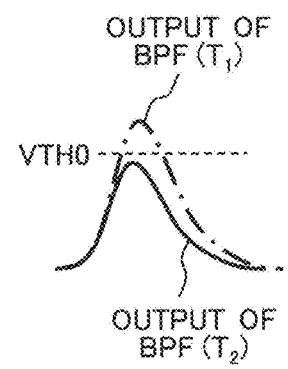
Figure 3C:
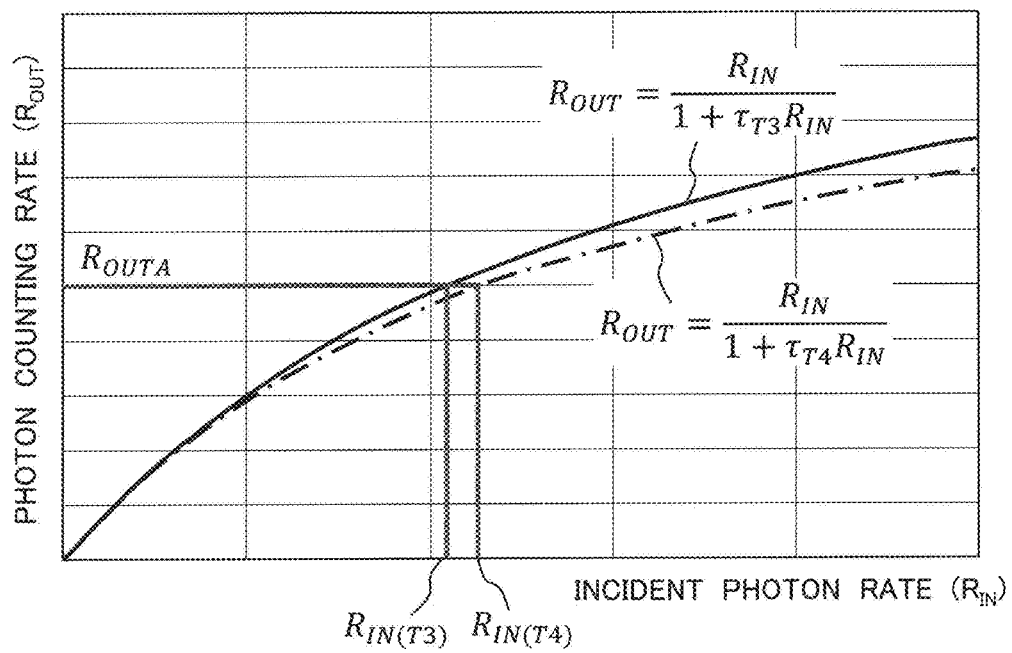

A relationship between operation and a temperature of a photon counting unit 30 is explained in reference to FIGS. 3A to 3C. In FIG. 3A, current pulses that are inputted to a PIN of a photon counting unit 30, voltage pulses that are outputs of a band pass filter 33, and outputs of a counter 35 are shown. The current pulses inputted to the PIN are shaped by a charge amplifier 32 and the band pass filter 33, and when a peak value of a voltage pulse after shaped exceeds a threshold value VTH0, the counter 35 counts the pulse. For example, in the case of the current pulses inputted at times t31 and t33, the peak values of the voltage pulses after shaped exceed the threshold value VTH0 and hence the counter 35 counts the pulses at times t32 and t34. In contrast, in the case of the current pulse inputted at time t35, the peak value of the voltage pulse after shaped does not exceed the threshold value VTH0 and hence the counter 35 does not count the pulse.

Meanwhile, a next current pulse cannot be counted during a period $\tau$ from when a current pulse is inputted to a PIN to when a voltage pulse after shaped is counted and hence $\tau$ is called a dead time and the upper limit of a photon counting rate of a photon counting unit 30 is defined as $1/\tau$. For example, when $\tau$ is 100 nsec, the upper limit of a photon counting rate is 10 Mcps. In a photon counting unit 30 having a dead time $\tau$, count loss of current pulses occurs and hence a photon counting rate $R_{OUT}$ outputted by the photon counting unit 30 is represented, for example, by the following expression including an incident photon rate $R_{IN}$ that is a number of photons incident per unit time and a dead time $\tau$.

$$R_{OUT} = R_{IN}/(1+\tau R_{IN}) \quad \text{(Expression 1)}$$

In the meantime, since a charge amplifier 32 and a band pass filter 33 constituting a photon counting unit 30 have a capacitance C and a resistance R, which are variable in response to temperature, the shape of a voltage pulse outputted from the band pass filter 33 varies in response to temperature. Voltage pulses at different temperatures T1 and T2 are shown in FIG. 3B as examples of voltage pulses the shapes of which vary in response to temperature. The peak value of the voltage pulse at the temperature T1 is higher than that at the temperature T2, the threshold value VTH0 also varies in response to temperature, and hence the voltage pulses may be counted or may not be counted at the photon counting unit 30 even when the current pulses inputted in a PIN are identical.

Since a pulse width of a voltage pulse also varies in response to temperature as shown in FIG. 3B and the response speeds of voltage comparator 34, etc. and a counter 35 also have temperature dependency, a dead time $\tau$ also varies in response to temperature, and errors are caused when an incident photon rate $R_{IN}$ is calculated from a photon counting rate $R_{OUT}$ on the basis of Expression 1. An example of varying a relationship between $R_{OUT}$ and $R_{IN}$ in response to temperature is shown in FIG. 3C. Here, a dead time at the temperature T3 is defined as $\tau_{T3}$, a dead time at the temperature T4 is defined as $\tau_{T4}$, and the expression $\tau_{T3} < \tau_{T4}$ is defined as being satisfied. Since a relationship between $R_{OUT}$ and $R_{IN}$ varies also when a dead time changes by change of temperature, an error is generated between an incident photon rate $R_{IN(T3)}$ calculated at the temperature T3 and an incident photon rate $R_{IN(T4)}$ calculated at the temperature T4 to a certain photon counting rate $R_{OUTA}$.

As stated above, since measurement error related to a peak value and a pulse width of a voltage pulse is generated when a temperature of a photon counting unit 30 varies, it is important to keep the operation temperature of the photon counting unit 30 constant.

Figure 4A:
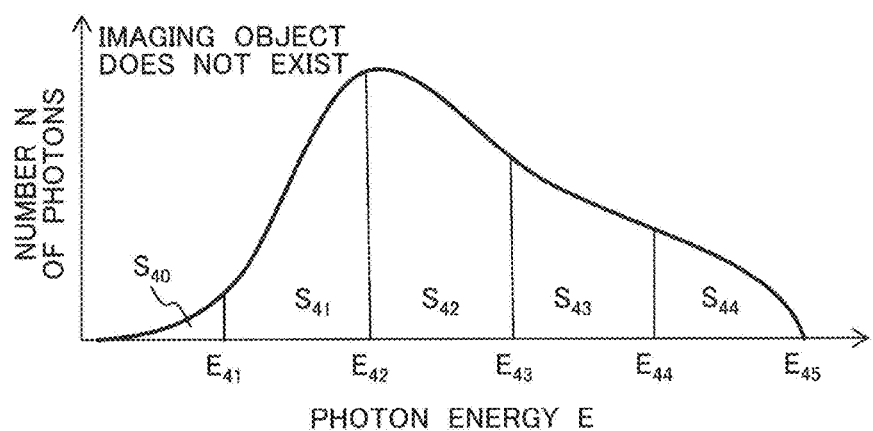
FIGS. 4A and 4B are views explaining a relationship between an energy spectrum of photons and a calorific value of a photon counting unit when an imaging object does not exist.
Figure 4B:
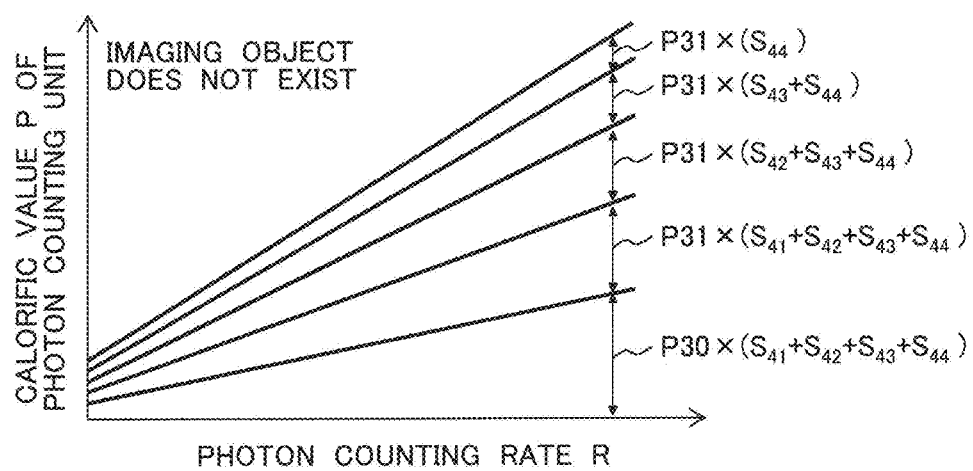

A relationship between an energy spectrum of photons and a calorific value of a photon counting unit 30 is explained in reference to FIGS. 4 and 4B. FIG. 4A is a schematic view showing an energy spectrum when an X-ray discharged from an X-ray tube having a tungsten-made target material directly enters an X-ray detector 2 without penetrating an imaging object 7. Photons are counted for each of the photon energy levels in a photon counting type X-ray detector 2. Here, the threshold values between photon energy levels are defined as $E_{41}$, $E_{42}$, $E_{43}$, $E_{44}$, and $E_{45}$ in an ascending order and the numbers of photons are defined as $S_{40}$, $S_{41}$, $S_{42}$, $S_{43}$, and $S_{44}$ at respective photon energy levels. A threshold voltage VTH corresponding to each threshold value is applied to a photon counting unit 30. For example, VTH1 is set so as to be equal to the voltage value of a pulse generated by photons having the energy $E_{41}$ and VTH2 is set so as to be equal to the voltage value of a pulse generated by photons having the energy $E_{42}$. If an example of measurement conditions is described in more detail, when an X-ray tube voltage is 120 kV for example, the threshold values are $E_{41}=20$ keV, $E_{42}=45$ keV, $E_{43}=70$ keV, $E_{44}=95$ keV, and $E_{45}=120$ keV.

A relationship between a photon counting rate R and a colorific value P when the photon counting unit 30 counts photons having the energy spectrum in FIG. 4A is shown in FIG. 4B. Since a charge amplifier 32 and a band pass filter 33 operate to all the numbers of photons, a value $P30 \times (S_{40}+S_{41}+S_{42}+S_{43}+S_{44})$ obtained by multiplying a calorific value P30 per one pulse by all the numbers of photons is the calorific value of the charge amplifier 32 and the band pass filter 33. Here, although the number of photons $S_{40}$ is lower than the detection lower limit energy $E_{41}$ and cannot be counted, $S_{40}$ is sufficiently low and is neglected and the calorific value of the charge amplifier 32 and the band pass filter 33 is approximated by $P30 \times (S_{41}+S_{42}+S_{43}+S_{44})$.

Since a voltage comparator 34 and a counter 35 operate to photons of the energy $E_{41}$ or more, a value $P31 \times (S_{41}+S_{42}+S_{43}+S_{44})$ obtained by multiplying a calorific value P31 per one pulse by the numbers of photons of the energy $E_{41}$ or more is the calorific value of the voltage comparator 34 and the counter 35. Likewise, since a voltage comparator 36 and a counter 37 operate to photons of the energy $E_{42}$ or more, a value $P31 \times (S_{42}+S_{43}+S_{44})$ is the calorific value. Since the same applies to the case of a calorific value of a voltage comparator and a counter operating to photons of the energy $E_{43}$ or more, a total calorific value P in a photon counting unit 30 is given by the following expression.

$$P = P30 \times (S_{41} \times S_{42} \times S_{43} \times S_{44}) \\ + P31 \times (S_{41} + S_{42} + S_{43} + S_{44}) \quad \text{(Expression 2)}$$

$$+P31\times(S_{42}\times S_{43}+S_{44})$$
$$+P31\times(S_{43}+S_{44})$$
$$+P31\times(S_{44})$$

When the shape of an energy spectrum of photons is substantially constant, for example when an X-ray tube voltage is constant, each of the numbers of photons $S_{41}$, $S_{42}$, $S_{43}$, and $S_{44}$ is proportional to a photon counting rate R. Each of the terms in Expression 2 therefore is proportional to a photon counting rate R and the total calorific value P of the photon counting unit 30 that is the sum of the terms is also proportional to a photon counting rate R as shown in FIG. 4B. The calorific values P30 and P31 per one pulse generated at respective circuit elements are obtained by simulation, actual measurement, or the like and the numbers of photons $S_{41}$, $S_{42}$, $S_{43}$, and $S_{44}$ at respective photon energy levels are counted by the photon counting unit 30. The total calorific value P of the photon counting unit 30 therefore can be estimated by using P30, P31, $S_{41}$, $S_{42}$, $S_{43}$, and $S_{44}$. Otherwise, a total calorific value P may also be estimated further by adding a calorific value at a semiconductor layer 21 to Expression 2. Estimation accuracy can be improved further by adding the calorific value at the semiconductor layer 21.

Further, when the shape of an energy spectrum of photons is substantially constant, since a ratio of the number of photons at each of the photon energy levels is also constant, it is also possible to make use of the ability to estimate a number of photons at another photon energy level from a number of photons at a certain photon energy level. For example, it is also possible to calculate a total calorific value P by estimating a number of photons $S_{40}$ in the detection lower limit energy $E_{41}$ and lower from the number of photons $S_{41}$ and changing the first term in Expression 2 to $P30\times(S_{40}+S_{41}+S_{42}+S_{43}+S_{44})$. The calculation accuracy of the total calorific value P can be improved by estimating the number of photons $S_{40}$.

Furthermore, it is also possible to inhibit a calculation quantity required of the calculation of a total calorific value P by making use of the ability to estimate a number of photons at another photon energy level from a number of photons at a certain photon energy level. For example, it is also possible to estimate a number of photons $S_{44}$ at the energy level $E_{44}$ and higher from the ratios of $S_{41}$, $S_{42}$, $S_{43}$, and $S_{44}$ obtained in advance, and calculate $P31\times S_{44}$ that is the fifth term in Expression 2 by using the estimated $S_{44}$. Likewise, it is also possible to estimate the number of photons ($S_{43}+S_{44}$) at the energy level $E_{43}$ and higher, and use the estimated value for calculating $P31\times(S_{43}+S_{44})$ that is the fourth term in Expression 2. The frequency of multiplication in the calculation of a total calorific value P can be reduced by using a value estimated from a ratio of a number of photons obtained in advance.

Meanwhile, a calculation quantity reduced in response to the number of estimated energy levels and an error included in a calculated total calorific value P are in the relationship of trade off. A number of estimated energy levels therefore may desirably be adjusted appropriately in response to the specifications of applied equipment.

Figure 5A:
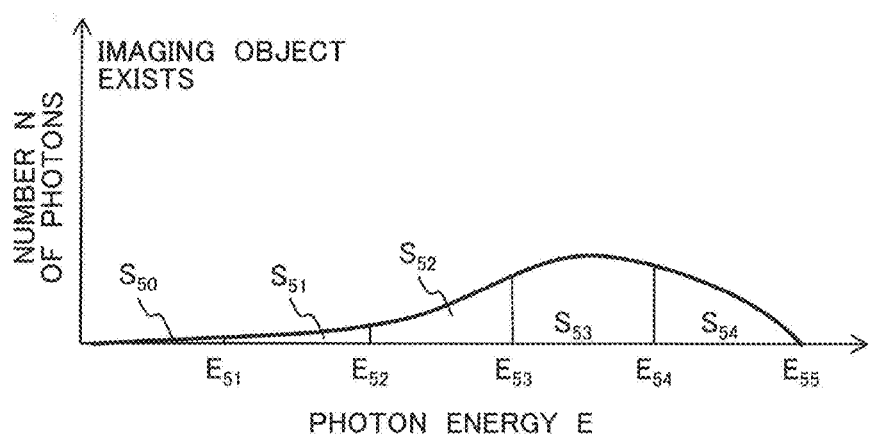
FIGS. 5A and 5B are views explaining a relationship between an energy spectrum of photons and a calorific value of a photon counting unit when an imaging object exists.
Figure 5B:
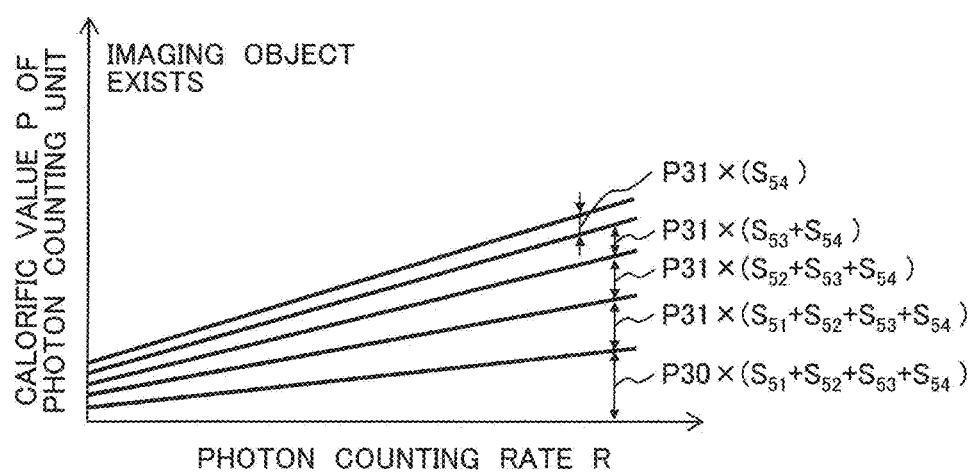

A relationship between an energy spectrum of photons and a calorific value of a photon counting unit 30 when an X-ray penetrates an imaging object 7 is explained in reference to FIGS. 5A and 5B. FIG. 5A is an example of an energy spectrum and FIG. 5B is a view showing a relationship between a photon counting rate R and a calorific value P in a photon counting unit 30. The threshold values between photon energy levels are $E_{51}$, $E_{52}$, $E_{53}$, $F_{54}$, and $E_{55}$ in an ascending order and the numbers of photons at respective photon energy levels are $S_{50}$, $S_{51}$, $S_{52}$, $S_{53}$, and $S_{54}$ in sequence. A threshold voltage VTH corresponding to each threshold value is applied to a photon counting unit 30 similarly to FIGS. 4 and 4B. Further, when an X-ray tube voltage is 120 kV, the threshold values are $E_{51}$=20 keV, $E_{52}$=45 keV, $E_{53}$=70 keV, $E_{54}$=95 keV, and $E_{55}$=120 keV, similarly to the case where an imaging object 7 does not exist. Even in the case where an X-ray passes through an imaging object 7, a total calorific value P in a photon counting unit 30 is obtained by the following expression similarly to Expression 2.

$$P=P30\times(S_{51}\times S_{52}\times S_{53}\times S_{54}) \quad \text{(Expression 3)}$$
$$+P31\times(S_{51}+S_{52}+S_{53}+S_{54})$$
$$+P31\times(S_{52}\times S_{53}+S_{54})$$
$$+P31\times(S_{53}+S_{54})$$
$$+P31\times(S_{54})$$

When the shape of an energy spectrum of photons is substantially constant similarly to the case where an imaging object does not exist, each of the numbers of photons $S_{51}$, $S_{52}$, $S_{53}$, and $S_{54}$ is proportional to a photon counting rate R and hence a total calorific value P of a photon counting unit 30 is also proportional to a photon counting rate R. Then, since P30, P31, $S_{51}$, $S_{52}$, $S_{53}$, and $S_{54}$ can be acquired respectively, a total calorific value P of the photon counting unit 30 can be estimated from Expression 3. Further, it is also similar to the case where an imaging object does not exist to be able to make use of the result of estimating a number of photons at another photon energy level from a number of photons at a certain photon energy level. Here, an energy spectrum in the case where an imaging object exists is obtained by shooting a phantom that simulates the imaging object in advance.

Figure 6:
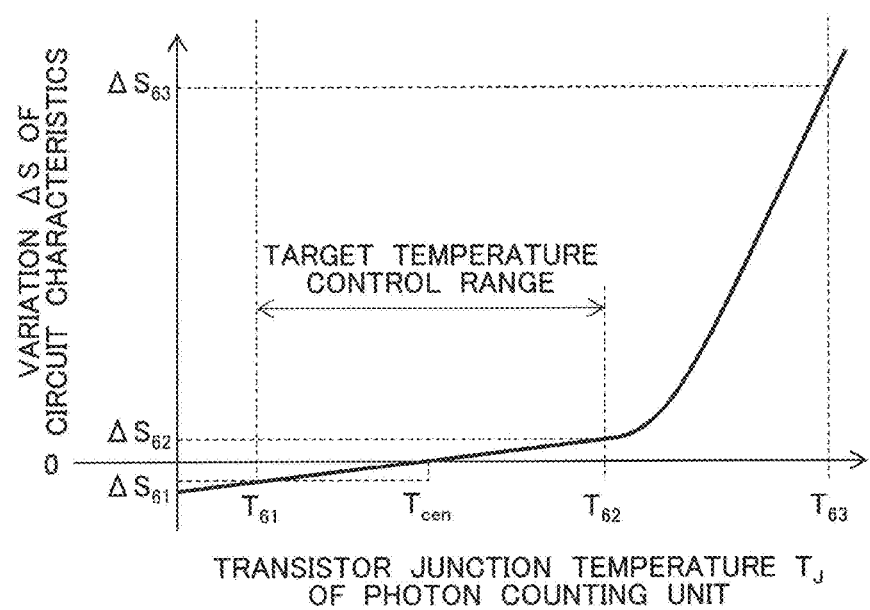
FIG. 6 is a view showing a relationship between a transistor junction temperature in a photon counting unit and a variation of circuit characteristics.

Influence which temperature fluctuation of a photon counting unit 30 gives to circuit characteristics is explained in reference to FIG. 6. Here, the circuit characteristics include measurement errors related to a peak value and a pulse width of a voltage pulse, a dead time τ, those being explained in FIGS. 3A to 3C, and the like, for example. In a transistor generally used in a photon counting unit 30, parasitic resistance, leak current, and the like vary in response to a temperature of a junction called a P-N junction. Further, mobility varies in response to a temperature of an inversion layer in a transistor. Furthermore, a value of a capacitance including a conductor, an insulator, and the like also varies in response to an ambient temperature. Since the junction, the inversion layer, and the capacitance are adjacent and closely heat-bonded to each other, a temperature of those components is referred to as a transistor junction temperature $T_J$ hereunder. In FIG. 6 therefore, a variation ΔS of circuit characteristics is taken on a vertical axis and a transistor junction temperature $T_J$ of a photon counting unit 30 is taken on a horizontal axis. Further, a range of a transistor junction temperature in which a variation ΔS of circuit characteristics falls within a desired range of $ΔS_{61}$ to $ΔS_{62}$ is set at $T_{61}$ to $τ_{62}$, a center temperature of $T_{61}$ to $T_{62}$ is set at $T_{CEN}$, a temperature at which a transistor runs away thermally is set at $T_{63}$, and ΔS at the temperature $T_{63}$ is set at $\Delta S_{63}$. As shown in FIG. 6, whereas $\Delta S$ varies linearly and the width of $\Delta S_{61}$ to $\Delta S_{62}$ is narrow when $T_J$ is in a target temperature control range that is the range of $T_{61}$ to $\tau_{62}$, $\Delta S$ varies nonlinearly and the width of $\Delta S_{62}$ to $\Delta S_{63}$ is large in the range exceeding $T_{62}$.

Since an X-ray CT apparatus requires high accuracy measurement, change of circuit characteristics during measurement has to be inhibited from influencing image quality. For example, the variation $\Delta S_{63}$ of circuit characteristics when a photon counting rate increases and a transistor junction temperature becomes $T_{63}$ is not allowed. The temperature of a transistor junction therefore has to be kept in the range of $T_{61}$ to $T_{62}$ so that the variation of the circuit characteristics may fall within the range of $\Delta S_{61}$ to $\Delta S_{62}$ by always securing a coolability adequate to a calorific value of a photon counting unit 30.

Figure 7A:
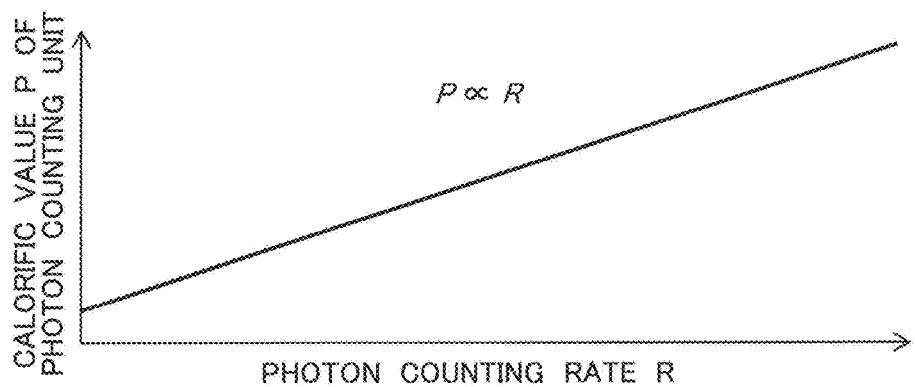
FIGS. 7A to 7C are views showing a relationship of a calorific value, a coolability, a cooling fan rotation speed, and a transistor junction temperature of a photon counting unit to a photon counting rate.
Figure 7B:
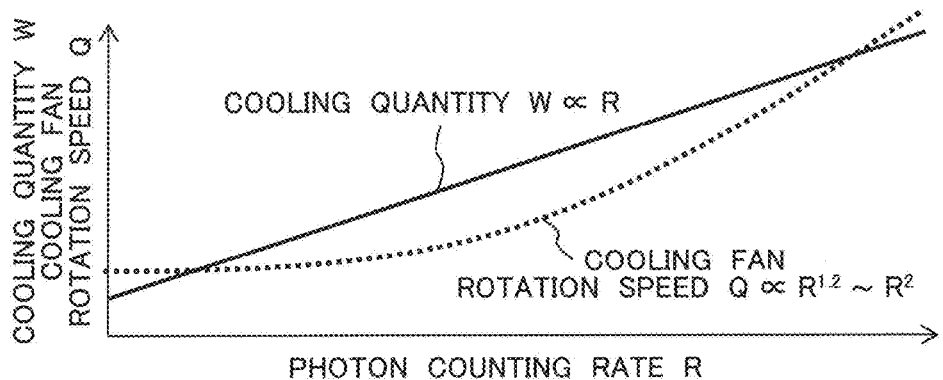
Figure 7C:
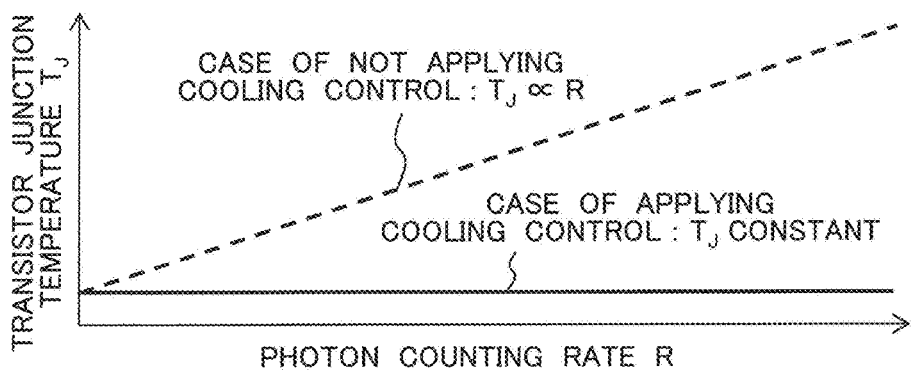

Coolability control for keeping a temperature of a transistor junction in a desired range is explained in reference to FIGS. 7A to 7C. FIG. 7A is a view showing a relationship between a photon counting rate R and a calorific value P in a photon counting unit 30 and the photon counting rate R and the calorific value P are in a linear relationship as explained in FIGS. 4 and 5. In the present embodiment therefore, a coolability W required for cooling a photon counting unit 30 is controller linearly to a photon counting rate R obtained from an output of the photon counting unit 30 as shown in FIG. 7B. Here, when a photon counting unit 30 is air-cooled by a cooling fan 8, a rotation speed Q of the cooling fan 8 is controlled so as to be proportional to a coolability W raised to the power of 1.2 to 2, the coolability W and a photon counting rate R are in a linear relationship, and hence the rotation speed Q is controlled so as to be proportional to the photon counting rate R raised to the power of 1.2 to 2. A transistor junction temperature $T_J$ rising in response to a photon counting rate R can be maintained substantially constant as shown in FIG. 7C by controlling the coolability W of a photon counting unit 30 so as to correspond to a calorific value P.

Figure 8A:
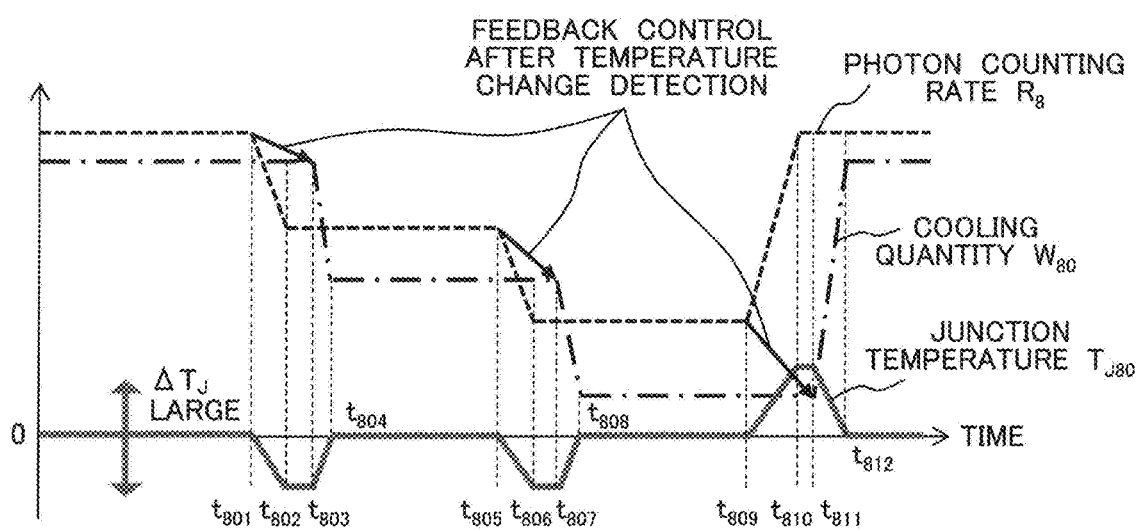
FIGS. 8A and 8B are views comparing feedback control based on temperature change with feed forward control based on the change of a photon counting rate.
Figure 8B:
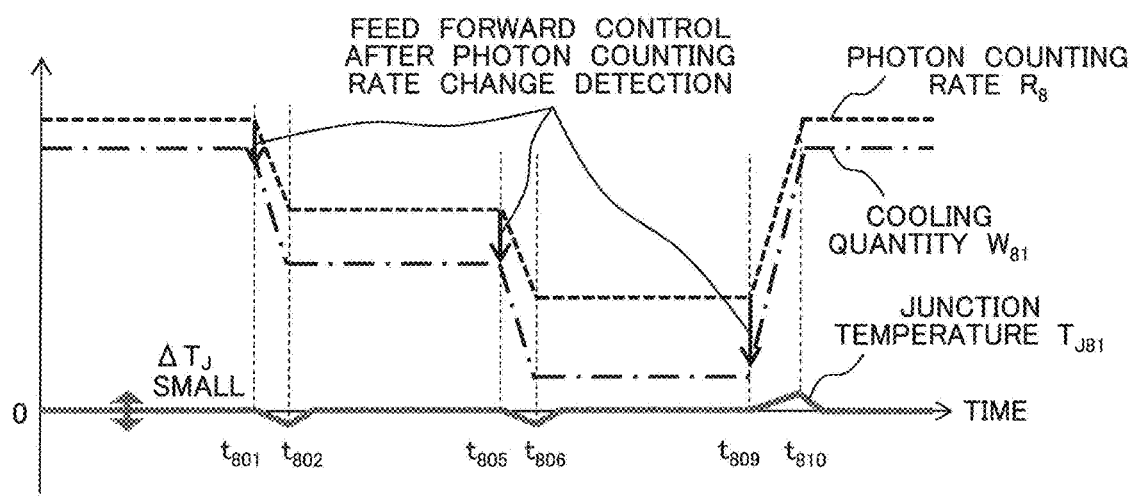

Coolability control according to the present embodiment is explained in comparison with prior art in reference to FIGS. 8A and 8B. FIG. 8A is an example of feedback control of a coolability based on temperature change detection of an X-ray detector 2 in prior art and FIG. 8B is an example of feed forward control of a coolability based on photon counting rate change detection according to the present embodiment. Here, in FIGS. 8A and 8B, the horizontal axis represents time and the vertical axis represents a photon counting rate $R_8$, cooling quantities $W_{80}$ and $W_{81}$, and transistor junction temperatures $T_{J80}$ and $T_{81}$. The photon counting rate $R_8$ is obtained by simulating a case of shooting a human body or the like as an imaging object 7 and changes at times $t_{801}$ to $t_{802}$, $t_{805}$ to $t_{806}$, and $t_{809}$ to $t_{810}$ in both FIGS. 8A and 8B.

In FIG. 8A, a calorific value of a photon counting unit 30 varies in response to the change of a photon counting rate $R_8$, a temperature sensor attached to an X-ray detector 2 detects the temperature change caused by the variation of the calorific value, and resultantly a coolability $W_{80}$ is controlled through feedback. Delays therefore are caused until the times $t_{803}$, $t_{807}$, and $t_{811}$ when the feedback control of the coolability $W_{80}$ based on the detection of the temperature sensor starts even though the photon counting rate $R_8$ starts to change at the times $t_{801}$, $t_{805}$, and $t_{809}$. As a result, a transistor junction temperature $\tau_{J80}$ changes greatly at the periods $t_{801}$ to $t_{803}$, $t_{805}$ to $t_{807}$, and $t_{809}$ to $t_{811}$ when a calorific value of a photon counting unit 30 generated in proportion to a photon counting rate $R_8$ and the coolability $W_{80}$ do not balance and hence a temperature fluctuation width $\Delta T_J$ during a shooting period increases.

On the other hand, in FIG. 8B, feed forward control of a coolability $W_{81}$ starts immediately at the times $t_{801}$, $t_{805}$, and $t_{809}$ when a photon counting unit 30 detects the change of a photon counting rate $R_8$. As a result, the balance of a calorific value and a coolability $W_{81}$ in a photon counting unit 30 is maintained, the change of a transistor junction temperature $T_{J81}$ is small, and a temperature fluctuation width $\Delta T_J$ is inhibited.

Figure 9:
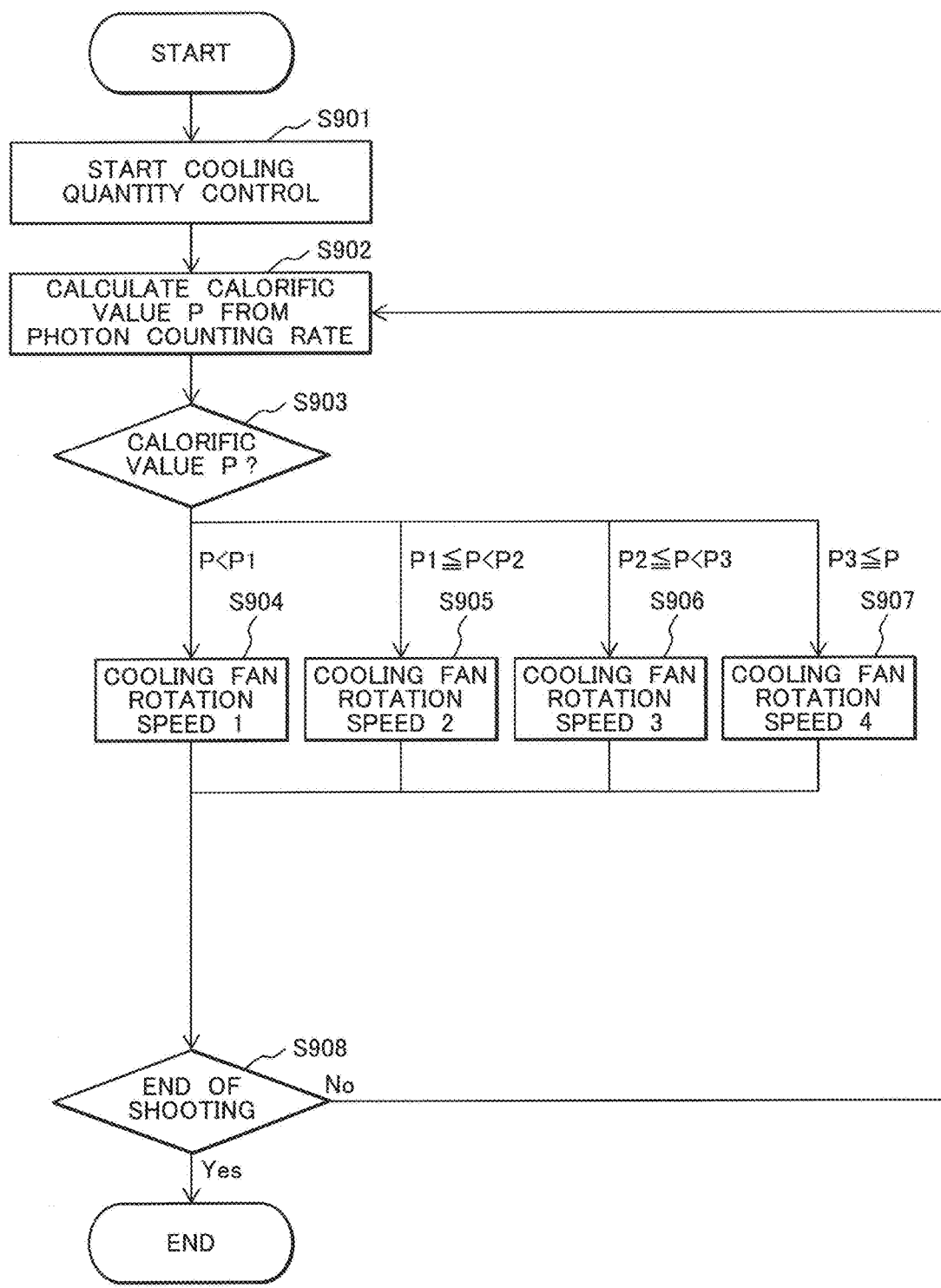
FIG. 9 is a view showing a flow of processing in coolability control according to a first embodiment.

A flow of processing in coolability control according to the present embodiment is explained in reference to FIG. 9.

(S901)

Prior to the start of scanning with an X-ray CT apparatus, a cooling fan controller 9 starts coolability control as a signal processing unit 3 notifies an X-ray detector 2 of preparation for scanning.

(S902)

The cooling fan controller 9 calculates a calorific value P of a counting circuit 22 from a photon counting rate obtained by shooting.

(S903 to s907)

The cooling fan controller 9 decides a cooling fan rotation speed in response to the calorific value P calculated at S902. In FIG. 9, the calorific value P is divided into four stages in ascending order and different cooling fan rotation speeds are set at the respective stages. Here, the division of the calorific value P is not limited to four stages and the number of stages may be increased or decreased appropriately.

A cooling fan rotation speed is not limited to be decided by a calorific value P obtained through Expression 2 or Expression 3 but may also be decided by using a table showing a relationship among a photon counting rate, a calorific value, and a cooling fan rotation speed as shown in FIGS. 10A and 10B, for example. Control can be simplified by using such a table as shown in FIGS. 10A and 10B. Here, FIG. 10A is a table in the case where an imaging object does not exist and FIG. 10B is a table in the case where an imaging object exists. Since an energy spectrum varies in accordance with the existence or nonexistence of an imaging object as shown in FIGS. 4A to 5B, it is desirable to arrange tables in accordance with the existence or nonexistence of an imaging object. A relationship between a calorific value and a cooling fan rotation speed varies in response to thermal resistance of a detection element 20, an air volume of a cooling fan 8, an air volume-static pressure characteristic, and the like and hence is obtained in advance by simulation, actual measurement, or the like.

Further, since an energy spectrum varies also by a composition of an imaging object, a plurality of tables may be prepared in conformity with a composition of an imaging object. For example, when an imaging object is a human body, a table may be prepared to an energy spectrum after having penetrated water accounting for the majority of the human body. Otherwise, a table of the case of adding calcium that is the main component of a bone or iodine that is the main component of a contrast medium may be prepared in conformity with an imaging site or an inspection type.

A range of photon counting rates on the tables shown in FIGS. 10A and 10B is decided by a maximum value of an incident photon rate for each pixel calculated on the basis of an output of an X-ray source 1. Further, a pitch width of photon counting rates in the table is desirably set at a value equal to or lower than a grain size necessary for the control of a coolability. For example, if a maximum value of an incident photon rate for each pixel is 50 Mcps and a necessary grain size is 51 stages, $R_{1001}$=0 Mcps, $R_{1002}$=1 Mcps, . . . , $R_{1031}$=50 Mcps are obtained.

Meanwhile, in an X-ray CT apparatus, a high accuracy measurement is required of a shooting when the attenuation rate of an X-ray is large, in other words, when a photon counting rate is low. Consequently, a pitch width of photon counting rates may not be equalized over a whole range but be reduced more in the range of lower photon counting rates. A high accuracy measurement is obtained in shooting when a photon counting rate is low by reducing the pitch width of the photon counting rates in the range of low photon counting rates. For example, a table of a calorific value and a cooling fan rotation speed is prepared at a smaller pitch width in the range of 20% or less of the maximum value 50 Mcps of an incident photon rate, namely in the range of 10 Mcps or lower.

Further, in a range of high photon counting rates, a calorific value of a counting circuit 22 is large and a transistor junction temperature tends to deviate from a target temperature control range. In a range of high photon counting rates therefore, a table of a calorific value and a cooling fan rotation speed may be prepared at a smaller pitch width. (S908)

The cooling fan controller 9 judges whether or not the shooting is finished on the basis of notification from the signal processing unit 3. The processing returns to S902 if shooting is not finished and the flow of the processing ends if shooting is finished.

A coolability is controlled in response to a photon counting rate of a photon counting unit 30 by the flow of the processing explained above and hence the temperature fluctuation width of a transistor junction can be inhibited even when a dose incident on an X-ray detector 2 changes.

Figure 11A:
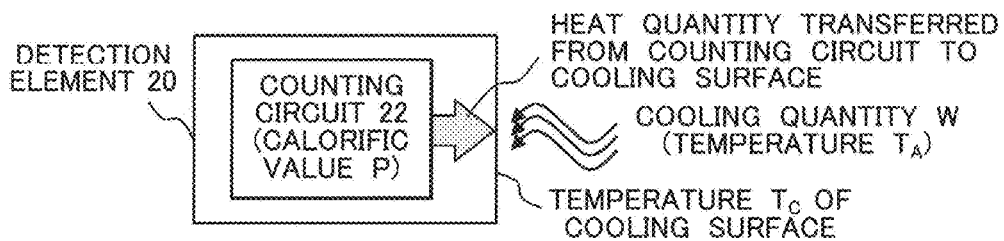
FIGS. 11A to 11D are views explaining a coolability controlled in response to fluctuation of a photon counting rate.
Figure 11B:
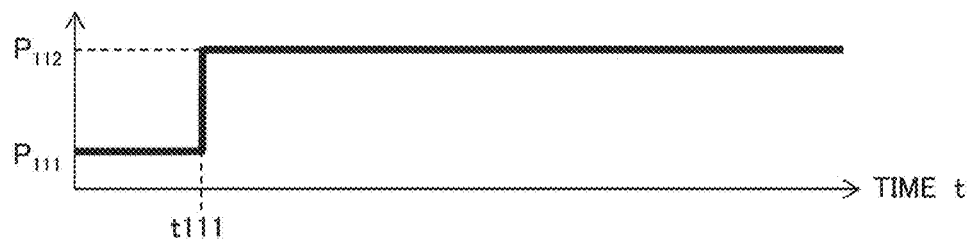
Figure 11C:
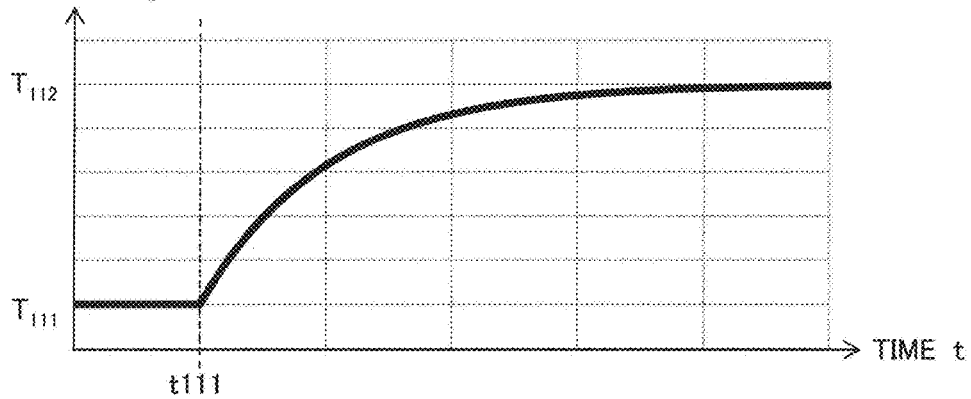

Control of inhibiting the temperature fluctuation width of a transistor junction even when a dose incident on an X-ray detector 2 changes suddenly is explained in reference to FIG. 11A to 11D. A state of cooling a cooling surface that is the surface of a detection element 20 equipped with a counting circuit 22 having a calorific value P by a fluid of a temperature $T_A$ is shown in FIG. 11A. When a calorific value P proportional to a photon counting rate R increases from $P_{111}$ to $P_{112}$ at time $t_{111}$ as shown in FIG. 11B, change of a temperature $T_C$ on the cooling surface with the passage of time is represented by the following expression and a graph shown in FIG. 11C is obtained if a coolability by the fluid does not change before and after the time $t_{111}$.

$$T_C(t)=T_{112}-(T_{112}-T_{111})\cdot\exp\{-(t-t_{111})/\text{time constant}\}$$
$$(t \geq t_{111}) \quad \text{(Expression 4)}$$

Here, $\tau_{111}$ is a temperature before the time $t_{111}$, $T_{112}$ is a temperature after a sufficient time has elapsed from the time $t_{111}$, and the time constant is decided by a thermal conductivity of a detection element 20 and the like.

In order to inhibit the temperature $T_C$ on the cooling surface shown in FIG. 11C and a temperature fluctuation width of a transistor junction, heat generated by a calorific value P of a counting circuit 22 and transferred to the cooling surface has to be thermally transferred to a fluid at the cooling surface. The heat transferred to the cooling surface is proportional to a calorific value P and hence the thermal transfer to the fluid of the temperature $T_A$ can be represented with a coolability W necessary for cooling a detection element 20 by the following expression.

$$P \propto W \cdot (T_C - T_A) \quad \text{(Expression 5)}$$

Further, after the time $t_{111}$, the calorific value P is $P_{112}$ and constant, the temperature $T_A$ of the fluid is constant, and hence, from Expression 5, a necessary coolability W is expressed as a function of $T_C$ shown by the following expression.

$$W \propto P/(T_C - T_A) \quad \text{(Expression 6)}$$

Figure 11D:
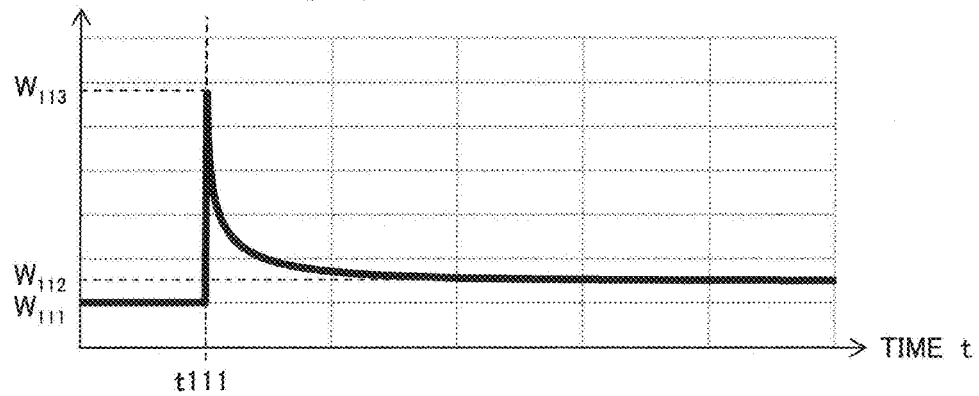

A coolability W obtained from Expression 6 is shown in FIG. 11D. The coolability W takes a value $W_{113}$ larger than the coolability $W_{112}$ that is a value at the time having sufficiently elapsed from the time $t_{111}$ because $T_C - T_A$ is small immediately after the time $t_{111}$. That is, immediately after the calorific value P has increased, it is desirable that the coolability W overshoots. Then, after the coolability W overshoots, it is desirable to bring the coolability W gradually close to the coolability $W_{112}$ on the basis of the time constant in Expression 4.

By the control of a coolability explained above, it is possible to inhibit a temperature fluctuation width of a transistor junction even when a dose incident on an X-ray detector 2 changes suddenly.

Figure 12A:
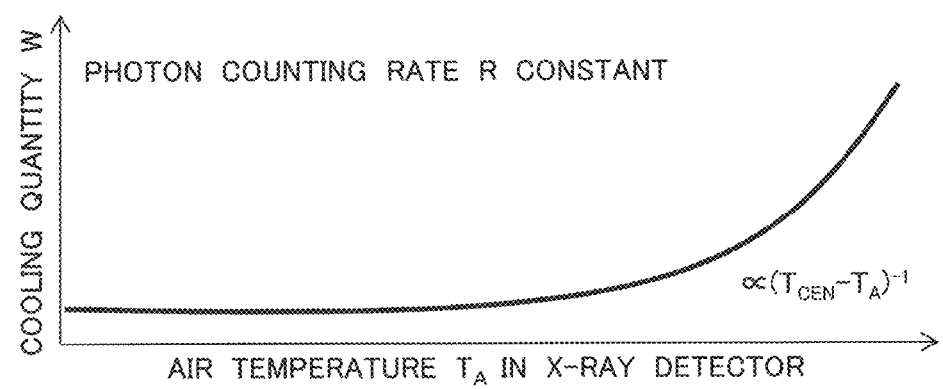
FIGS. 12A and 12B are views explaining a coolability controlled in response to temperature change of air in an X-ray detector.
Figure 12B:
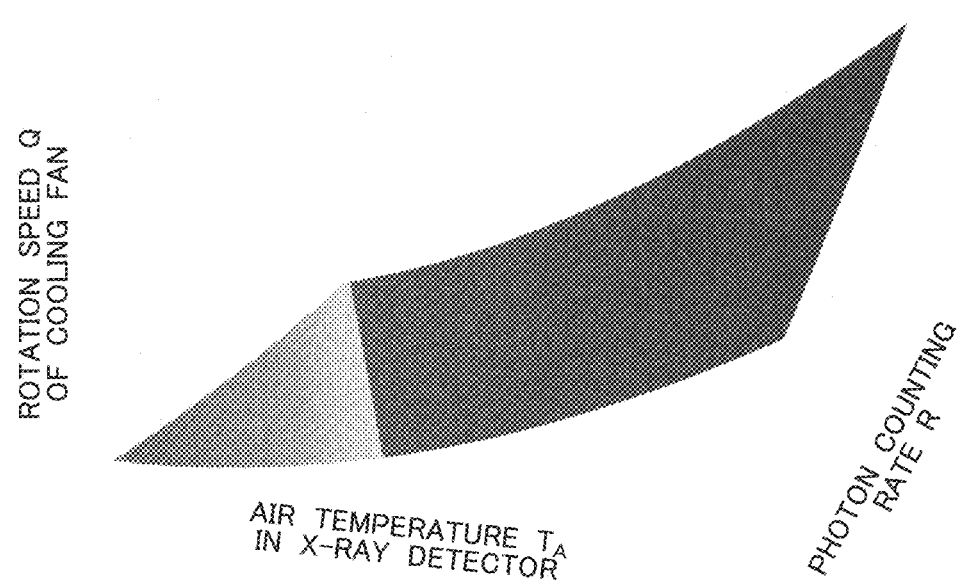

Control of a coolability when a temperature $T_A$ of air in an X-ray detector 2, namely a fluid used for cooling, changes is explained in reference to FIGS. 12A and 12B. Since a heat source such as an X-ray source 1 exists in addition to an X-ray detector 2 in a scanner of an X-ray CT apparatus, an air temperature in the X-ray detector 2 changes. If $T_C$ is replaced with a center temperature $T_{CEN}$ in a target temperature control range that is to be attained by the control of a coolability in Expression 6, the center temperature $T_{CEN}$ is constant and hence, if a calorific value P is constant, a coolability W becomes a function of the air temperature $T_A$ in the X-ray detector 2. A relationship between an air temperature $T_A$ in an X-ray detector 2 and a coolability W when a photon counting rate R is constant, in other words a calorific value P is constant, is shown in FIG. 12A. As shown in FIG. 12A, a coolability W may be increased in response to the rise of an air temperature $T_A$ in order to satisfy a center temperature $T_{CEN}$.

Further, when a rotation speed Q of a cooling fan is controlled so as to be proportional to a coolability W in Expression 6 raised to the power of 1.2 to 2, the rotation speed Q is represented by the following expression. Here, a calorific value P is proportional to a photon counting rate R.

$$Q \propto \{R/(T_{CEN}-T_A)\}^{1.2} \text{ to } \{R/(T_{CEN}-T_A)\}^2 \quad \text{(Expression 7)}$$

A rotation speed Q of a cooling fan controlled in response to changes of a photon counting rate R and an air temperature $T_A$ in an X-ray detector 2 is shown in FIG. 12B. As shown in FIG. 12B, a rotation speed Q may be increased in response to the rise of a photon counting rate R and an air temperature $T_A$ in order to satisfy a center temperature $T_{CEN}$.

Figure 13:
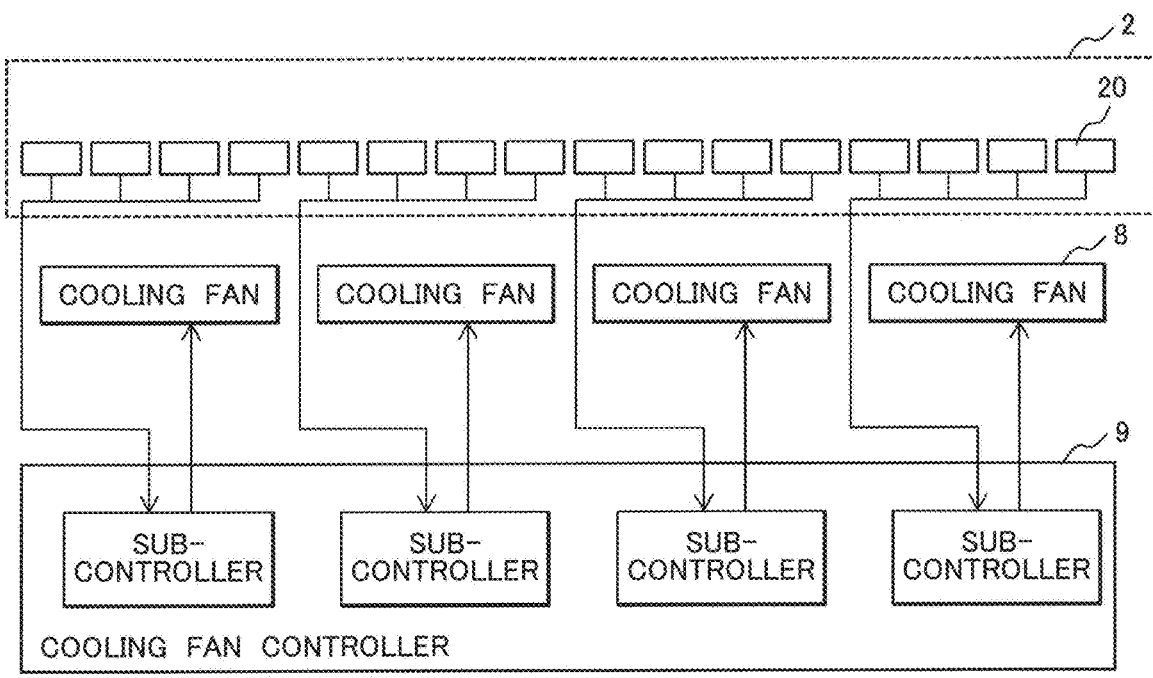
FIG. 13 is a view showing a configuration of cooling fans and a cooling fan controller to cool detection elements according to the first embodiment.

A specific configuration of cooling fans 8 and a cooling fan controller 9, those constituting a cooling section to cool an X-ray detector 2, is explained in reference to FIG. 13. A plurality of, for example dozens of, detection elements 20 are arranged arcuately in a channel direction, namely in a direction of rotating a scanner, in the X-ray detector 2. In FIG. 13 here, sixteen detection elements 20 arranged linearly in a horizontal direction are shown for convenience.

A plurality of cooling fans 8 are arranged in order to air-cool detection elements 20 in an X-ray detector 2. Whereas a size of a detection element 20 is several centimeters, a size of a cooling fan 8 is several tens of centimeters and hence one cooling fan 8 is allocated to several detection elements 20. Each of the cooling fans 8 is controlled individually by a sub-controller installed in a cooling fan controller 9. Each of the sub-controllers calculates a rotation speed of a cooling fan 8 in response to photon counting rates obtained from counting circuits 22 in detection elements 20 and controls the cooling fan 8. Expression 2, Expression 3, the tables exemplified in FIGS. 10A and 10B, and others are used for calculating a rotation speed of a cooling fan 8. Here, a flow rate of water flowing in a water cooling pipe is controlled when the water cooling pipe is used in place of a cooling fan 8 and an electrical signal inputted into a Peltier element is controlled when the Peltier element is used.

A number of detection elements 20 cooled by one cooling fan 8 is not limited to four exemplified in FIG. 13 and is modified appropriately. Further, a number of detection elements 20 cooled by one cooling fan 8 may be modified in response to positions where the detection elements 20 are arranged. For example, since a center part in an arrangement of detection elements 20 requires a higher accuracy measurement than end parts, it may also be possible to reduce the number of detection elements 20 cooled by one cooling fan 8 at the center part so as to be smaller than the end parts and control a coolability more precisely.

Figure 14A:
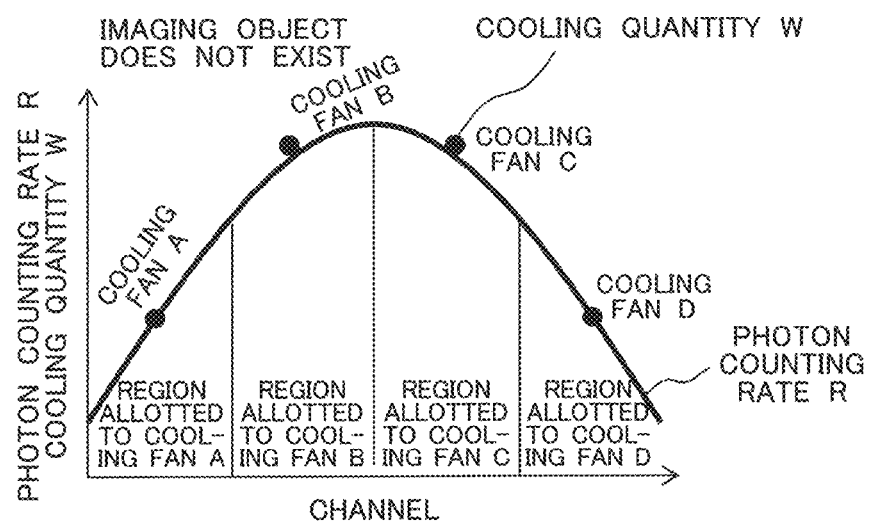
FIGS. 14A and 14B are views comparing the cases of using and not using coolability control according to the first embodiment when an imaging object does not exist.
Figure 14B:
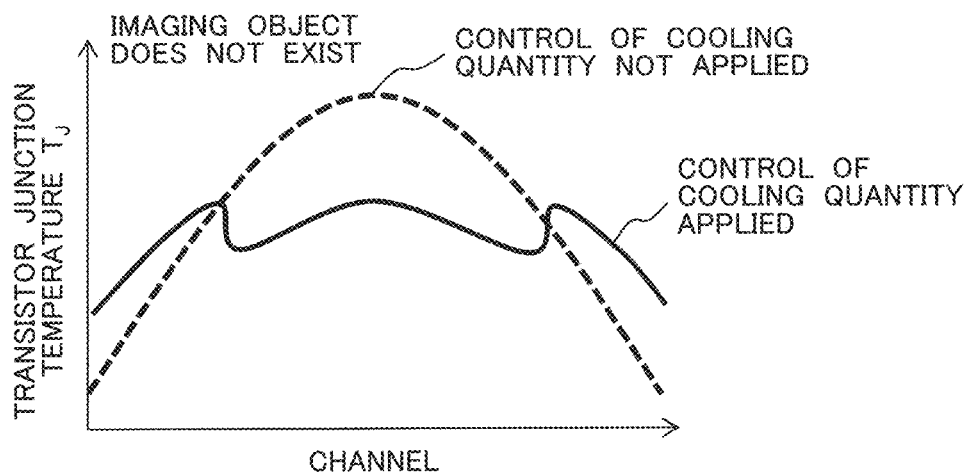

Control of a coolability when a plurality of detection elements 20 are cooled by one cooling fan 8 is explained in reference to FIGS. 14A and 14B. Photon counting rates R and cooling quantities W obtained on the basis of the photon counting rates R in the channel direction in the arrangement of the detection elements 20 when an imaging object does not exist are shown in FIG. 14A. A photon counting rate R obtained in an X-ray CT apparatus is high at a channel center part and low at channel end parts when an imaging object does not exist. In FIG. 14A, the arrangement of the detection elements 20 is cooled by the cooling fans A to D and each of the cooling fans A to D covers each of the four regions divided in the channel direction.

Whereas the multiple detection elements 20 included in each of the allotted regions take different photon counting rates, a coolability of each allotted region is controlled by a rotation speed of one cooling fan. It is desirable therefore to control a rotation speed of a cooling fan by using an average value of photon counting rates R in an allotted region or a center value between a maximum value and a minimum value of photon counting rates R in an allotted region. When an average value is used, calculation of a rotation speed of a cooling fan from photon counting rates R can be abbreviated. Further, when a center value between a maximum value and a minimum value is used, a center value of a fluctuation width of transistor junction temperatures in an allotted region can be controlled to a target value with a high degree of accuracy.

The difference in distribution of a transistor junction temperature $T_J$ between the cases of controlling and not controlling a coolability is shown in FIG. 14B. As shown in FIG. 14A, a large coolability W is set in response to a high photon counting rate R at the channel center part that is a region allotted to the cooling fans B and C. In contrast, a small coolability W is set in response to a low photon counting rate R at the channel end part that is a region allotted to the cooling fans A and D. By controlling a coolability W in this way, a width of the distribution of a transistor junction temperature $T_J$ is inhibited as shown in FIG. 14B.

Figure 15A:
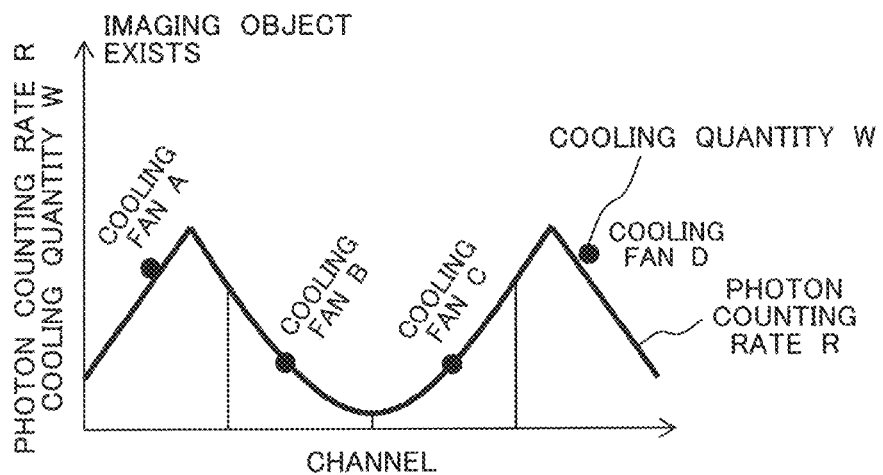
FIGS. 15A and 15B are views comparing the cases of using and not using coolability control according to the first embodiment when an imaging object exists.
Figure 15B:
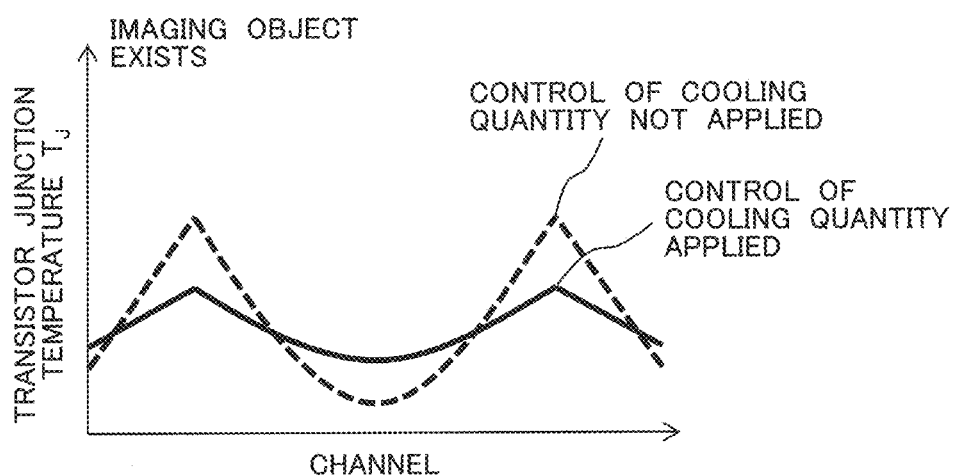

Control of a coolability when an imaging object exists and a plurality of detection elements 20 are cooled by one cooling fan 8 is explained in reference to FIGS. 15A and 15B. Photon counting rates R and cooling quantities W obtained on the basis of the photon counting rates R in the channel direction when an imaging object exists are shown in FIG. 15A, similarly to FIG. 14A. An X-ray attenuates by an imaging object when the imaging object exists and hence a photon counting rate R becomes lower at the channel center part than at the channel end part. The cooling fans A to D cool the detection elements 20 in respective allotted regions and a rotation speed of a cooling fan is controlled by using an average value of the photon counting rates R or a center value between a maximum value and a minimum value in an allotted region similarly to the case where an imaging object does not exist.

The difference in distribution of a transistor junction temperature $T_J$ between the cases of controlling and not controlling a coolability is shown in FIG. 15B. A width of the distribution of a transistor junction temperature $T_J$ is inhibited also in the case where an imaging object exists similarly to FIG. 14B by controlling cooling quantities of the cooling fans A to D in response to the photon counting rates R in the respective allotted regions. By controlling a coolability W in this way, a rotation speed of a cooling fan to which the region where an imaging object is placed is allotted, namely the region where the attenuation of an X-ray is large and reduction of noise is required, becomes small. The reduction of a rotation speed of a cooling fan not only reduces electrical noise and contributes to the improvement of image quality but also inhibits noise and improves the environment of an imaging object during shooting.

Correction processing for reducing influence of a variation of circuit characteristics of a photon counting unit 30 generated by a temperature difference among detection elements 20, that is, a variation of measurement errors related to a peak value and a pulse width of a voltage pulse and the like, is explained in reference to FIGS. 16A to 16C. Photon counting rates R and cooling quantities W obtained on the basis of the photon counting rates R in the channel direction in the arrangement of the detection elements 20 when an imaging object does not exist are shown in FIG. 16A, similarly to FIG. 14A. Whereas the multiple detection elements 20 included in each of the regions allotted to the cooling fans A to D take different photon counting rates R, a coolability in each allotted region is controlled by using a center value $R_{CEN}$ ($=(R_{MAX}+R_{MIN})/2$) between a maximum value $R_{MAX}$ and a minimum value $R_{MIN}$ of the photon counting rates R in the allotted region. As a result, as shown in FIG. 16B, the width of the distribution of a transistor junction temperature $T_J$ is inhibited. Here, a temperature deviation $T_{DEV}$ ($=T_J-T_{CEN}$) to a center temperature $T_{CEN}$ is proportional to the deviation of photon counting rates R to the center value $R_{CEN}$ and is represented by the following expression.

$$T_{DEV} \propto (R - R_{CEN}) \quad \text{(Expression 8)}$$

A variation $\Delta S$ of circuit characteristics of a photon counting unit 30 caused by a temperature deviation $T_{DEV}$ of Expression 8 falls within the range of $\Delta S_{61}$ to $\Delta S_{62}$ in FIG. 6. Since $\Delta S$ changes linearly in the range of $\Delta S_{61}$ to $\Delta S_{62}$ of FIG. 6, $\Delta S$ can be corrected with sufficient accuracy by linear interpolation based on the temperature deviation $T_{DEV}$. A specific procedure of correction processing for correcting a variation $\Delta S$ of circuit characteristics of a photon counting unit 30 generated by a temperature difference among detection elements 20 is explained hereunder. Here, the correction processing is carried out by the signal processing unit 3 and the like.

Firstly, a temperature deviation $T_{DEV}$ is calculated from the deviation of a photon counting rate R and a center value $R_{CEN}$. Successively, a correction coefficient C that is a coefficient for correcting a variation $\Delta S$ of circuit characteristics in response to the temperature deviation $T_{DEV}$ is read out from the table shown in FIG. 16C. Here, the correction coefficient C is a dimensionless coefficient to cancel temperature dependence of a dead time τ in Expression 1. For example, in the case of $T_3=T_{CEN}$ and $T_4=T_{CEN}+T_{DEV}$ in FIG. 3C, a coefficient for correcting an incident photon rate $R_{IN(T3)}$ calculated from a photon counting rate $R_{OUT4}$ to $R_{IN(T4)}$ is the correction coefficient C. The table in FIG. 16C summarizes the relationships among a deviation of a photon counting rate R and $R_{CEN}$, a temperature deviation $T_{DEV}$, and a correction coefficient C, is obtained by simulation, actual measurement, or the like in advance, and is stored in a storage device or the like. Here, the correction coefficient C may also be calculated through a low order approximate expression if necessary. Further, in order to further increase the accuracy of correction, a plurality of tables may also be used separately in response to a center temperature $T_{CEN}$. Finally, by multiplying a photon counting rate R by a correction coefficient C, the correction processing is completed.

By such correction processing, it is possible to correct a variation of circuit characteristics of a photon counting unit 30 generated by a temperature difference among detection elements 20 easily. Further, since a temperature difference may be caused among pixels by the difference in photon counting rate among the pixels in a detection element 20 in some cases, a variation of circuit characteristics of a photon counting unit 30 may be corrected among pixels. Here, in correction processing among pixels, it is desirable to apply correction processing not only to a temperature distribution in the channel direction of an X-ray detector 2 but also to a temperature distribution in a rotation axis direction of a scanner.

Figure 17:
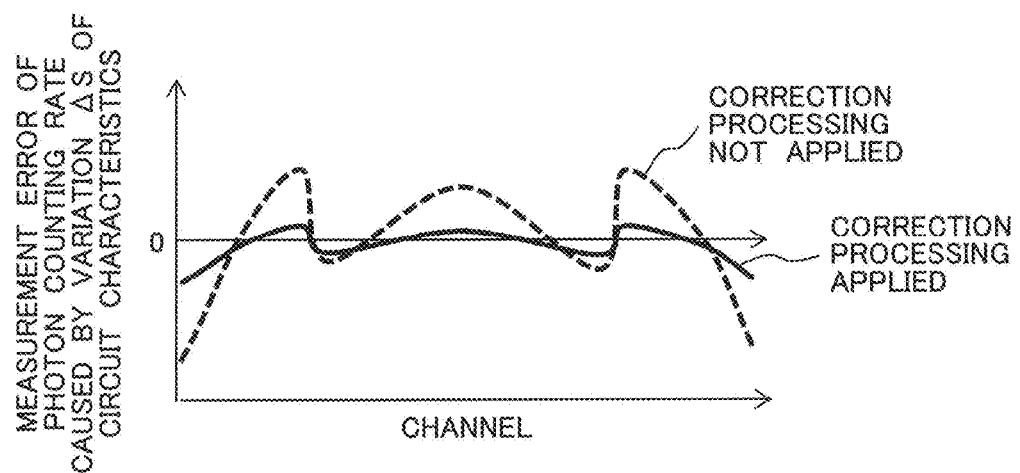
FIG. 17 is a view showing the effect of correction processing in FIGS. 16A to 16C.

Effects of correction processing explained in reference to FIGS. 16A to 16C are explained in reference to FIG. 17. FIG. 17 shows a distribution of measurement errors of photon counting rates caused by a variation ΔS of circuit characteristics in a channel direction in the arrangement of detection elements 20 and is a graph comparing a case of applying correction processing and a case of not applying correction processing when an imaging object does not exist. Measurement errors of photon counting rates caused by a variation ΔS of circuit characteristics are inhibited in the case of applying correction processing shown by the solid line in comparison with the case of not applying correction processing shown by the broken line.

Second Embodiment

A case of applying the control of a coolability to all the detection elements 20 installed in an X-ray detector 2 has been explained in the first embodiment. In the present embodiment, a case of limiting the control of a coolability to some of the detection elements 20 is explained. Since some of the configurations and functions explained in the first embodiment can be applied to the present embodiment, the explanations of similar configurations and functions are omitted here.

Figure 18:
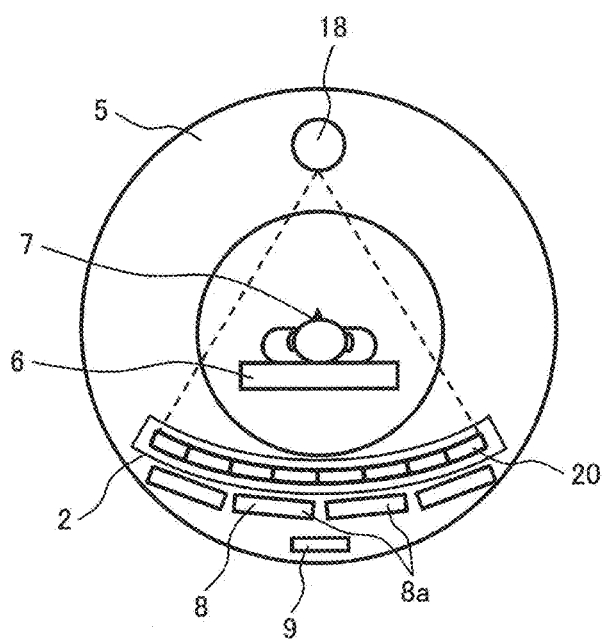
FIG. 18 is a view explaining an X-ray CT apparatus according to a second embodiment.

An X-ray CT apparatus according to the present embodiment is explained in reference to FIG. 18. Similarly to the first embodiment, detection elements 20 in an X-ray detector 2 are arranged arcuately around an X-ray source 1. At the center part of the arrangement of the detection elements 20, an X-ray having penetrated an imaging object 7 is detected and hence a high accuracy measurement is required. On the other hand, at the ends of the arrangement of the detection elements 20, an X-ray not having penetrated an imaging object 7 is detected and hence a high accuracy measurement is not required. In the present embodiment therefore, cooling fans 8a to cool the center part that detects an X-ray having penetrated an imaging object 7 are targeted for controlling a coolability in response to a photon counting rate.

According to the present embodiment, the control of a coolability of cooling fans 8 to cool the end parts of the arrangement of the detection elements 20 is not required and hence the configuration of an X-ray CT apparatus and arithmetic processing related to the control of a coolability can be simplified. Further, it is also possible to configure a cooling fan controller 9 so as to be able to control all the cooling fans 8 and switch cooling fans 8 the cooling quantities of which are controlled appropriately in response to a size or a location of an imaging object 7.

Third Embodiment

A case of estimating a number of photons at another photon energy level from a number of photons at a certain photon energy level on the basis of an energy spectrum of photons obtained by shooting a phantom simulating an imaging object in advance has been explained in the first embodiment. An energy spectrum of an X-ray having penetrated an imaging object varies depending on the imaging object and hence estimation accuracy is insufficient sometimes with an energy spectrum obtained by shooting a phantom. In the present embodiment therefore, a case of obtaining an energy spectrum for each imaging object by using a scanogram shot for each imaging object prior to actual shooting with an X-ray CT apparatus is explained. Here, a scanogram is a fluoroscopic image used for setting a shooting range of actual shooting or the like. Since some of the configurations and functions explained in the first embodiment can be applied to the present embodiment, the explanations of similar configurations and functions are omitted.

Figure 19A:
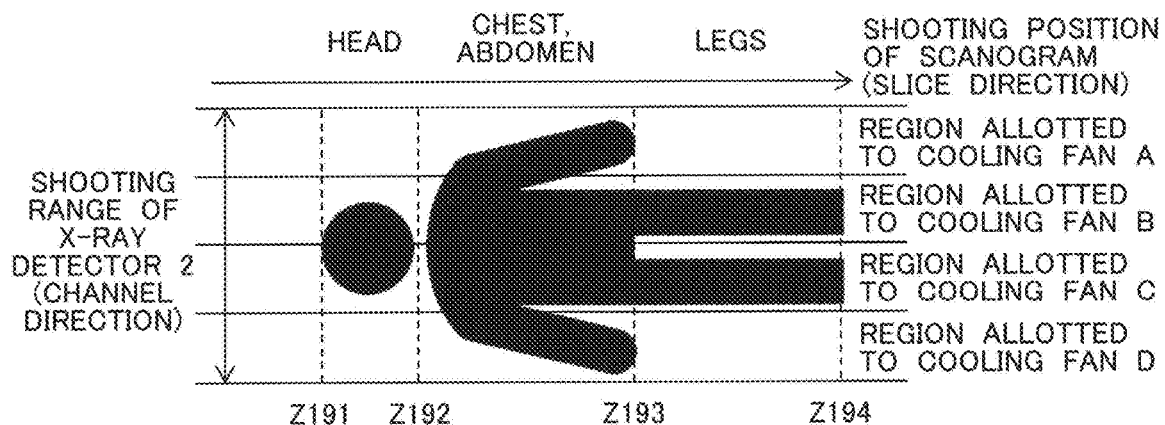
FIGS. 19A to 19C are views explaining a third embodiment.
Figure 19B:
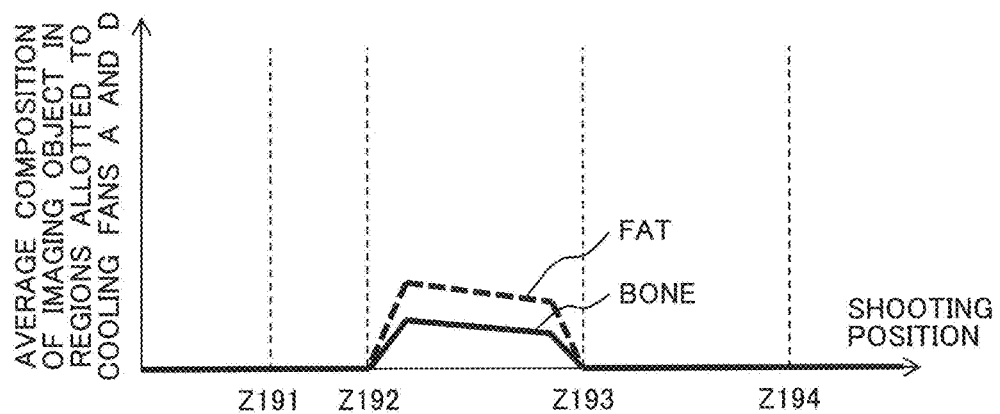
Figure 19C:
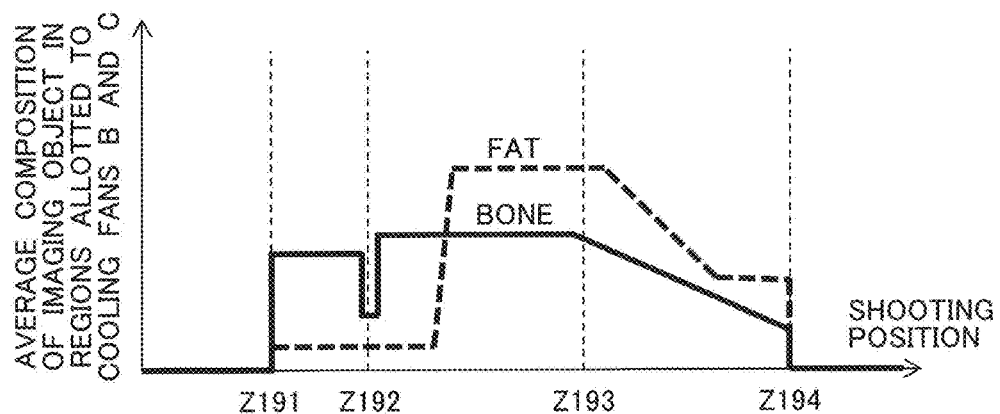

A composition of an imaging object estimated from a scanogram is explained in reference to FIGS. 19A to 19C. A positional relationship of a scanogram of an imaging object and respective regions allotted to cooling fans A to D is shown in FIG. 19A. The cooling fans A to D cool the respective allotted regions divided into four regions in a channel direction of an X-ray detector 2 that is a rotation direction of a scanner similarly to FIGS. 15A to 16B. In the example of FIG. 19A, the head, the chest and abdomen, and the legs of an imaging object are in the regions allotted to the cooling fans B and C and both the arms are in the regions allotted to the cooling fans A and D.

When an X-ray detector 2 is a photon counting type, the composition of an imaging object can be obtained for each pixel from a scanogram of the imaging object and hence an average composition of the imaging object in each of the regions allotted to the cooling fans A to D can be obtained for each of the shooting positions of the scanogram. A distribution of an average composition in the regions allotted to the cooling fans A and D is exemplified in FIG. 19B and a distribution of an average composition in the regions allotted to the cooling fans B and C is exemplified in FIG. 19C. Here, a shooting position 2191 corresponds to the tip of the head, a shooting position 2192 corresponds to the boundary between the head and the chest, a shooting position 2193 corresponds to the boundary between the abdomen and the legs, and a shooting position 2194 corresponds to the tips of the legs. Further, not only the average compositions of the fat and the bone exemplified in FIGS. 19B and 19C but also average compositions of a muscle, water, and the like may also be obtained.

Since an energy spectrum of X-rays having penetrated an imaging object is determined in response to a composition of the imaging object, an energy spectrum of each imaging object is obtained from such a distribution of an average composition as shown in FIG. 19B or 19C. In other words, since an energy spectrum of each imaging object is obtained by using a scanogram shot for the imaging object, a number of photons at another photon energy level can be estimated from a number of photons at a certain photon energy level with a high degree of accuracy.

According to the present embodiment as stated above, since a distribution of a composition of an imaging object is obtained from a scanogram shot for the imaging object and an energy spectrum is obtained by using the obtained distribution of the composition, an energy spectrum conforming to the imaging object can be obtained. Further, since a number of photons at another photon energy level can be estimated from a number of photons at a certain photon energy level with a high degree of accuracy by using the obtained energy spectrum, a coolability can be controlled with a high degree of accuracy.

Multiple embodiments of a radiation imaging apparatus according to the present invention have heretofore been explained. A radiation imaging apparatus according to the present invention is not limited to the above embodiments and can be embodied by modifying constituent components within a range not departing from the tenor of the invention. Further, a plurality of constituent components disclosed in the above embodiments may also be combined appropriately. Furthermore, some constituent components may be deleted from all the constituent components shown in the above embodiments. In addition, although the above embodiments have been explained on the basis of materializing the control of a coolability by hardware mounted on an LSI or the like, the control of a coolability may also be materialized by software implemented at a signal processing unit 3 or the like.

LIST OF REFERENCE SIGNS

1: X-ray source, 2: X-ray detector, 3: signal processing unit, 4: image generation unit, 5: rotation plate, 6: bed, 7: imaging object, 8: cooling fan, 9: cooling fan controller, 20: detection element, 21: semiconductor layer, 22: counting circuit, 30: photon counting unit, 31: output unit, 32: charge amplifier, 33: band pass filter, 34: voltage comparator, 35: counter, 36: voltage comparator, 37: counter

What is claimed is:

1. A radiation imaging apparatus having a radiation source, a radiation detector to detect radiation emitted from the radiation source, and a cooling unit to cool the radiation detector,
wherein the radiation detector has a counting circuit to output a number of photons in radiation counted per unit time as a photon counting rate;
the cooling unit controls a coolability of the radiation detector in response to the photon counting rate; and
the cooling unit makes the coolability overshoot immediately after the photon counting rate changes and brings the coolability gradually close to a predetermined value after the coolability overshoots.

2. The radiation imaging apparatus according to claim 1, wherein the cooling unit controls a coolability on the basis of a table showing a relationship between the photon counting rate and a calorific value of the counting circuit.

3. The radiation imaging apparatus according to claim 2, wherein the table is prepared in advance in response to the existence or nonexistence of an imaging object.

4. The radiation imaging apparatus according to claim 3, wherein the table is prepared in advance in response to a composition of the imaging object.

5. The radiation imaging apparatus according to claim 1, wherein the cooling unit controls the coolability on the basis of a temperature of a fluid used for cooling the radiation detector together with the photon counting rate.

6. The radiation imaging apparatus according to claim 1,
wherein the radiation detector has a semiconductor layer to output incident radiation as an electric charge corresponding to photons; and
the cooling unit controls the coolability in response to a calorific value of the semiconductor layer together with the photon counting rate.

7. The radiation imaging apparatus according to claim 1, wherein the cooling unit is allocated to a plurality of counting circuits and controls the coolability on the basis of a reference value calculated from respective photon counting rates outputted by the multiple counting circuits.

8. The radiation imaging apparatus according to claim 7, wherein the reference value is an average value of respective photon counting rates outputted by the multiple counting circuits.

9. The radiation imaging apparatus according to claim 1, wherein the cooling unit controls a coolability for cooling a part of the counting circuit.

10. The radiation imaging apparatus according to claim 9, wherein the cooling unit controls a coolability for cooling the counting circuit located at a center part in the radiation detector.

11. The radiation imaging apparatus according to claim 9, wherein the cooling unit switches a range in the counting circuit where a coolability is controlled in response to a size or a location of an imaging object.

12. A radiation imaging apparatus having a radiation source, a radiation detector to detect radiation emitted from the radiation source, and a cooling unit to cool the radiation detector, wherein:
the radiation detector has a counting circuit to output a number of photons in radiation counted per unit time as a photon counting rate;
the cooling unit controls a coolability of the radiation detector in response to the photon counting rate;
the cooling unit controls a coolability on the basis of a table showing a relationship between the photon counting rate and a calorific value of the counting circuit; and
in the table, pitch widths of the photon counting rate and the calorific value are smaller in a range where the photon counting rate is relatively low than in another range.

13. A radiation imaging apparatus having a radiation source, a radiation detector to detect radiation emitted from the radiation source, and a cooling unit to cool the radiation detector, wherein:
the radiation detector has a counting circuit to output a number of photons in radiation counted per unit time as a photon counting rate;
the cooling unit controls a coolability of the radiation detector in response to the photon counting rate;
the cooling unit controls a coolability on the basis of a table showing a relationship between the photon counting rate and a calorific value of the counting circuit; and in the table, pitch widths of the photon counting rate and the calorific value are smaller in a range where the photon counting rate is relatively high than in another range.

14. A radiation imaging apparatus according to claim 9, having a radiation source, a radiation detector to detect radiation emitted from the radiation source, and a cooling unit to cool the radiation detector, wherein:
the radiation detector has a counting circuit to output a number of photons in radiation counted per unit time as a photon counting rate,
the cooling unit controls a coolability of the radiation detector in response to the photon counting rate,
the counting circuit discriminates the radiation into a plurality of energy levels and outputs the photon counting rate for each of the energy levels,
the cooling unit estimates a second photon counting rate that is a photon counting rate at another energy level from a first photon counting rate that is a photon counting rate at a certain energy level and controls the coolability on the basis of the first photon counting rate and the second photon counting rate, and
the second photon counting rate is a photon counting rate at an energy level that cannot be counted by the counting circuit.

15. A radiation imaging apparatus having a radiation source, a radiation detector to detect radiation emitted from the radiation source, and a cooling unit to cool the radiation detector, wherein:
the radiation detector has a counting circuit to output a number of photons in radiation counted per unit time as a photon counting rate,
the cooling unit controls a coolability of the radiation detector in response to the photon counting rate,
the counting circuit discriminates the radiation into a plurality of energy levels and outputs the photon counting rate for each of the energy levels,
the cooling unit estimates a second photon counting rate that is a photon counting rate at another energy level from a first photon counting rate that is a photon counting rate at a certain energy level and controls the coolability on the basis of the first photon counting rate and the second photon counting rate, and
the cooling unit obtains a composition of an imaging object from a scanogram obtained prior to actual shooting and estimates the second photon counting rate by using an energy spectrum estimated on the basis of the obtained composition.

16. A radiation imaging apparatus having a radiation source, a radiation detector to detect radiation emitted from the radiation source, and a cooling unit to cool the radiation detector, wherein:
the radiation detector has a counting circuit to output a number of photons in radiation counted per unit time as a photon counting rate;
the cooling unit controls a coolability of the radiation detector in response to the photon counting rate;
the cooling unit is allocated to a plurality of counting circuits and controls the coolability on the basis of a reference value calculated from respective photon counting rates outputted by the multiple counting circuits; and
the reference value is a center value between a maximum value and a minimum value of respective photon counting rates outputted by the multiple counting circuits.

17. A radiation imaging apparatus having a radiation source, a radiation detector to detect radiation emitted from the radiation source, a cooling unit to cool the radiation detector, wherein:
the radiation detector has a counting circuit to output a number of photons in radiation counted per unit time as a photon counting rate;
the cooling unit controls a coolability of the radiation detector in response to the photon counting rate;
the cooling unit is allocated to a plurality of counting circuits and controls the coolability on the basis of a reference value calculated from respective photon counting rates outputted by the plurality of counting circuits; and
the radiation detector further comprises a signal processing unit to correct a variation of circuit characteristics among the plurality of counting circuits on the basis of differences between respective photon counting rates outputted by the plurality of counting circuits and the reference value.

\* \* \* \* \*